United States Patent
Taura et al.

(10) Patent No.: US 6,924,700 B2
(45) Date of Patent: Aug. 2, 2005

(54) CLASS D AMPLIFIER

(75) Inventors: Kenichi Taura, Tokyo (JP); Masayuki Tsuji, Tokyo (JP); Masayuki Ishida, Tokyo (JP); Tsuyoshi Nakada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 56 days.

(21) Appl. No.: 10/673,883

(22) Filed: Sep. 30, 2003

(65) Prior Publication Data

US 2004/0066229 A1 Apr. 8, 2004

(30) Foreign Application Priority Data

| Oct. 3, 2002 | (JP) | 2002-291195 |
| Nov. 18, 2002 | (JP) | 2002-333412 |
| Feb. 28, 2003 | (JP) | 2003-052385 |

(51) Int. Cl.[7] ............................................. H03F 3/217
(52) U.S. Cl. ................................. 330/251; 330/10
(58) Field of Search ........................... 330/251, 207 A, 330/10, 100

(56) References Cited

U.S. PATENT DOCUMENTS

| 4,015,213 A | * | 3/1977 | Hamada | 330/10 |
| 6,297,692 B1 | * | 10/2001 | Nielsen | 330/10 |
| 6,794,930 B1 | * | 9/2004 | Nurminen | 330/10 |

FOREIGN PATENT DOCUMENTS

| JP | 11-261347 A | 9/1999 |
| JP | 2001-502156 A | 2/2001 |
| JP | 2001-292040 A | 10/2001 |
| JP | 2001-517393 A | 10/2001 |
| WO | WO 98/44626 A2 | 10/1998 |
| WO | WO 99/08378 A2 | 2/1999 |

* cited by examiner

*Primary Examiner*—Henry Choe
(74) *Attorney, Agent, or Firm*—Birch, Stewart, Kolasch & Birch, LLP

(57) ABSTRACT

A pulse modulated signal (ei) output from a pulse modulator (1) and a feedback signal (ef) containing distortion caused by a power switch (3) are integrated in a first integrator (21) and a second integrator (24), respectively, and are input to input terminals of a comparator (25 or 29), respectively, so that a correction signal (Vc) is generated.

4 Claims, 21 Drawing Sheets

FIG. 3
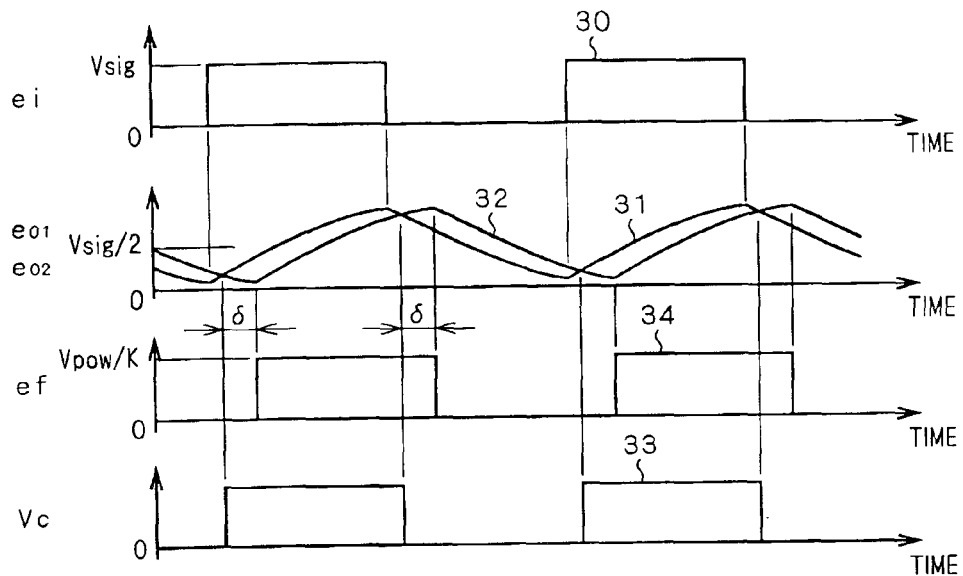
FIG. 4A
FIG. 4B
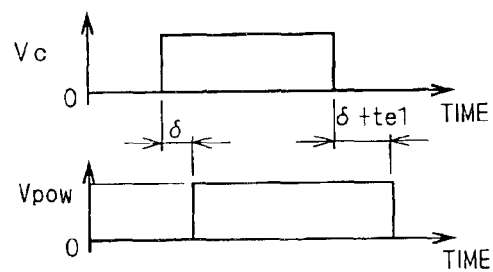
FIG. 5A
FIG. 5B
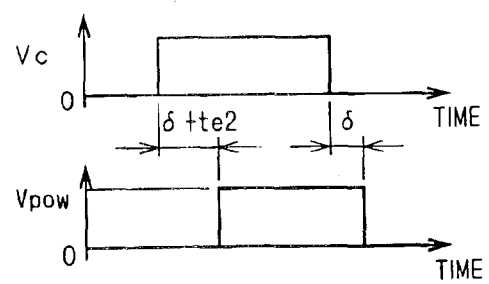

FIG. 6A
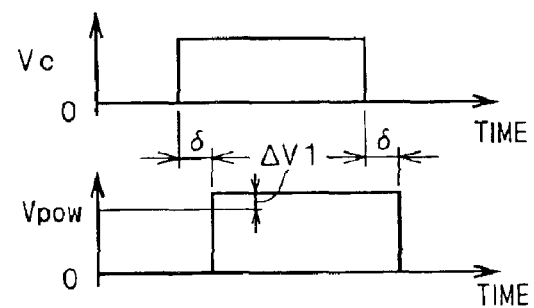
FIG. 6B
FIG. 7A
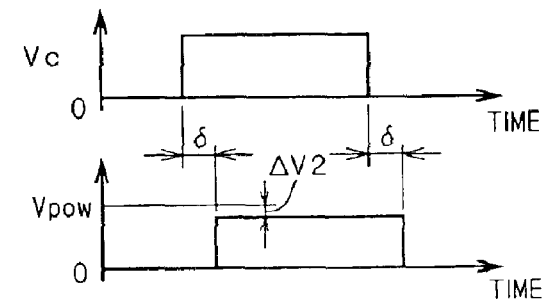
FIG. 7B
FIG. 8
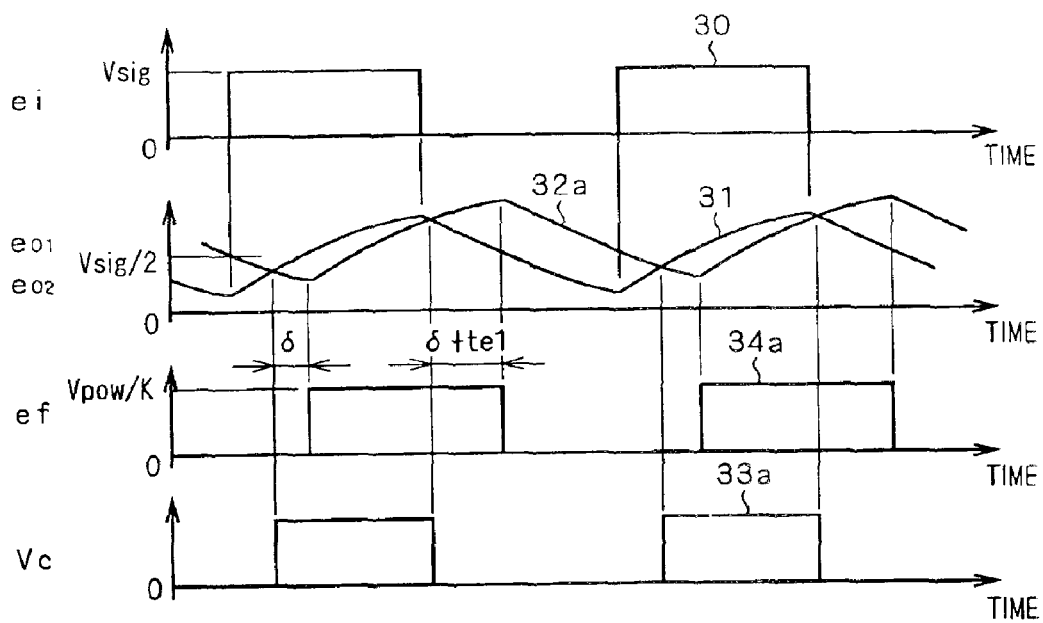

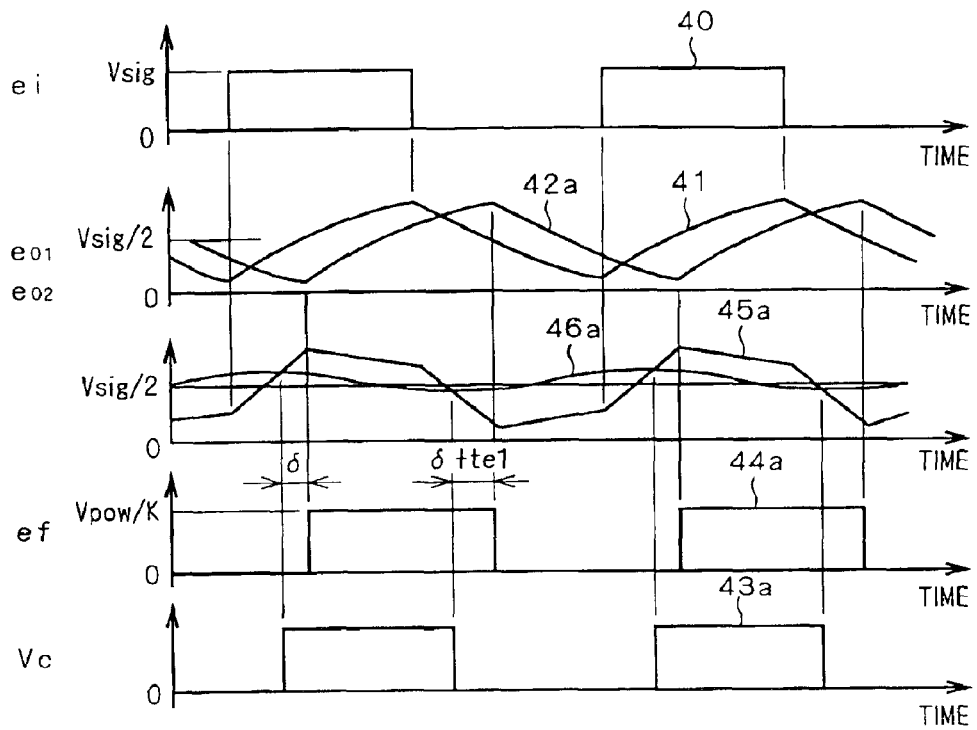
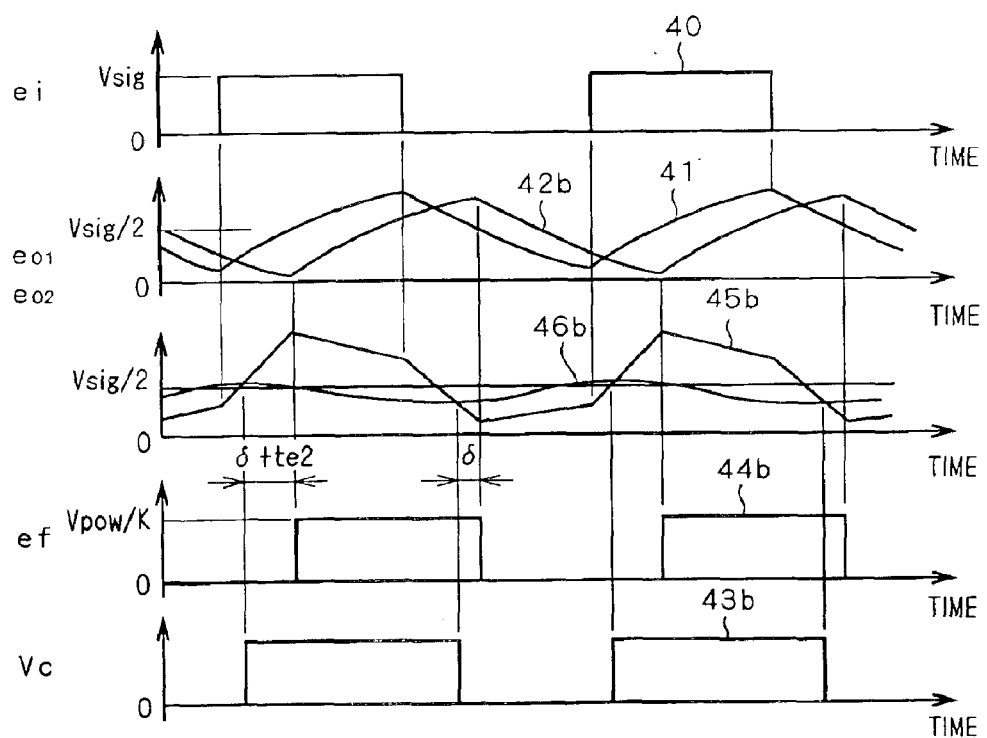

CLASS D AMPLIFIER

This Nonprovisional application claims priority under 35 U.S.C. § 119(a) on Patent Application No(s). 2002-299195, 2002-333412 and 2003-052385 filed in Japan on Oct. 3, 2002, Nov. 18, 2002 and Feb. 28, 2003, respectively, the entire contents of which are hereby incorporated by reference.

BACKGROUND OF THE INVENTION

1. Field of the Invention

The present invention relates to a class D amplifier, and more particularly to a class D amplifier having a correction circuit.

2. Description of the Background Art

Class D amplification has conventionally been adopted as a method of enabling device miniaturization by performing power amplification on audio signals with high efficiency and low power loss. A class D amplifier is known in which a digitized audio signal is directly converted to a pulse width modulated signal and is guided to a power switch. The power switch usually includes a switching device connected to a constant voltage power supply and a switching device connected to a ground (or negative power supply).

Further known is a method for reducing rounding errors caused by a requantizer required for the PWM (pulse width modulation) conversion by means of delta-sigma modulation, which allows a PWM (pulse width modulated) signal of high accuracy to be obtained. Such PWM signal is output from the power switch with high accuracy, so that an audio signal of high quality can be output from the class D amplifier (cf. Japanese Patent Application Laid-Open Nos. 11-261347 (1999) and 2001-292040).

However, the above-described method actually causes a problem in that the use of an ideal constant-voltage power supply for the power supply of the power switch is generally difficult to realize on cost grounds and a problem in that consumption power in the constant-voltage power supply is increased, which results in loss of inherent advantages of the class D amplifier. In view of these problems, compromises have been made in many cases, though not sufficient, which only suppresses an alternating component of audio frequency which particularly comes into question because of an LC filter.

Further, according to the above-described method, the power switching devices forming the power switch each have a finite delay time for turn-on and turn-off. Therefore, it is generally difficult to turn ON one of the switching device connected to the constant voltage power supply and the switching device connected to the ground, and turn OFF the other one with the same timing. Thus, it has been required to set a dead time after one of the devices is turned OFF almost completely and until the other one is turned ON.

The above-mentioned fluctuations in the supply voltage directly appear as fluctuations in the amplitude of an output signal from the power switch, causing distortion in an audio signal output from the amplifier.

Further, distortion in an output signal from the power switch resulting from the dead time setting also causes distortion in an audio signal output from the amplifier.

As measures for the aforementioned problems, a correction system according to a conventional technique is known (cf. National Publication of Translation No. 2001-51739; e.g., FIGS. 3–8). The conventional technique will specifically be described hereinbelow in reference to drawings showing the configuration.

FIG. 32 is a block diagram illustrating the configuration of a class D amplifier having a conventional correction system.

In FIG. 32, a pulse modulator 100, a correction unit 102, a power switch 103 and an LPF (low pass filter) 104 are connected in series to each other. Error handler 101 is connected between nodes N100 and N101 in parallel to the correction unit 102 and power switch 103 and has its output connected to the correction unit 102.

In the class D amplifier having the correction system configured as above described, the pulse modulator 100 generates a binary pulse modulated signal Vr by modulating an audio signal.

The power switch 103 performs power amplification by switching between a constant-voltage power source and the ground in accordance with a value of a correction signal Vc which is a binary pulse signal transmitted through the correction unit 102, enabling power supply to a load connected to the output of the amplifier. Here, the power switch 103 has a factor that causes distortion in an audio signal (hereinafter referred to as distortion factor) such as fluctuations in supply voltage and dead time setting for operations of the switching devices.

The error handler 101 detects deformation of an output signal generated by the power switch 103, and more specifically, detects an error contained in a feedback signal Vs output from the power switch 103 with reference to the pulse modulated signal Vr output from the pulse modulator 100, thereby generating and outputting an error signal Ve corresponding to the error.

The correction unit 102 corrects the pulse modulated signal Vr input from the pulse modulator 100 by changing its width in accordance with the error signal Ve from the error handler 101, thereby performing control so as to reduce the error signal Ve from the error handler 101.

The internal configuration of the correction unit 102 will specifically be described hereinbelow.

FIG. 33 is a block diagram illustrating the internal configuration of the correction unit 102. In FIG. 33, an integrator 200, an amplitude limiter 201 and a "−" terminal of a comparator 202 are connected in series to each other. The comparator 202 has its "+" terminal connected to the output part of the error handler 101 and its output part connected to the input of the power switch 103. The integrator 200 has its input connected to the output of the pulse modulator 100.

Next, operations of the respective components of the correction unit 102 will be described referring to FIG. 34 which illustrates signal waveforms at respective points in the correction unit 102.

In FIG. 34, reference numeral 210 represents a waveform of the pulse modulated signal Vr input to the integrator 200, and 211 represents a trapezoidal waveform of an input signal Vi input to the "−" terminal of the comparator 202 which is obtained from the pulse modulated signal Vr converted while passing through the integrator 200 and amplitude limiter 201. By the action of the integrator 200, the falling edge and rising edge of the trapezoidal waveform 211 are inclined at a certain angle. The amplitude of the trapezoidal waveform 211 is limited within a certain range by the action of the amplitude limiter 201.

The reference numerals 212 and 213 each represent a waveform of the error signal Ve output from the error handler 101 and input to the "+" terminal of the comparator 202, and 214 and 215 each represent a waveform of the correction signal Vc generated in and output from the comparator 202 by comparing the input signal Vi and error signal Ve input to the comparator 202.

Here, the waveforms 212 and 213 are derived from error signals Ve having different values from each other. The waveform 214 is derived from the correction signal Vc generated in the comparator 202 in accordance with the waveform 212, and waveform 215 is derived from the correction signal Vc generated in the comparator 202 in accordance with the waveform 213.

It can be seen from FIG. 34 that the comparator 202 in the correction unit 102 generates a correction signal Vc having a wide pulse width (i.e., the waveform 214) when the error signal Ve has a high potential (in the case of the waveform 212), and conversely, generates a correction signal Vc having a narrow pulse width (i.e., the waveform 215) when the error signal Ve has a low potential (in the case of the waveform 213).

Therefore, in generating the error signal Ve from the pulse modulated signal Vr input from the pulse modulator 100 used for a reference and the feedback signal Vs input from the power switch 103, the error handler 101 is configured so as to generate an error signal Ve lowered in potential as the waveform 213 in the case where the pulse width of a feedback signal Vs contains an error wider than or equivalent to the pulse width of a pulse modulated signal Vr used for a reference, and to generate an error signal Ve increased in potential as the waveform 212 in the case where the pulse width of a feedback signal Vs contains an error narrower than or equivalent to the pulse width of a pulse modulated signal Vr used for a reference.

The employment of the class D amplifier having the correction system of the aforementioned configuration can automatically reduce an error of the feedback signal Vs output from the power switch 103 with respect to the pulse modulated signal Vr used for a reference.

Thus, signal distortion caused by fluctuations in the supply voltage and dead time setting in the power switch 103 can be automatically corrected, which prevents the occurrence of distortion in an audio signal output from the amplifier.

However, the correction system performing correction by means of feedback in the class D amplifier disclosed in the National Publication of Translation 2001-517393 configured as described above gives rise to the following problems.

First, in order to improve the effects of correction, the signal Vi input to the "−" terminal of the comparator 202 needs to be converted to a trapezoidal waveform signal of high accuracy. However, generating a trapezoidal waveform signal with high accuracy disadvantageously requires a circuit configuration to be complicated as compared to the circuit shown in FIG. 33.

Second, a pulse modulated signal Vr and feedback signal Vs input to the error handler 101 are pulse signals. It is very difficult to normally generate an error signal Ve from such pulse signals, and remaining pulses in the error signal Ve cannot be removed completely. Such remaining pulses disadvantageously result in difficulty of obtaining sufficient effects of correction.

In the case where a remaining pulse component cannot be removed completely, the circuit operations are restricted. That is, when the pulse component is distorted in a nonlinear region of the correction unit 102, distortion occurs in the error signal Ve, which prevents correction from being performed properly. Thus, it is ideal that the error signal Ve generated in the error handler 101 should not contain a pulse component reflecting the difference between low frequency components of the pulse modulated signal Vr and feedback signal Vs.

Actually, however, phase rotation of the feedback signal Vs in the error handler 101 unstabilizes loop operations, which makes it difficult to filter the error handler 101 such that a pulse component is sufficiently attenuated. On the other hand, in order to obtain sufficient effects of feedback, the error signal Ve needs to be sufficiently amplified and corrected, which contradictorily causes a remaining pulse component to be amplified at the same time.

On the aforementioned grounds, it is difficult to obtain sufficient effects of correction (reduction of distortion in an audio signal) because of remaining pulses.

With the above-described publicly-known configuration, a PWM signal of high accuracy can be obtained, and an audio signal of high quality can be obtained as an output of the amplifier by reflecting the PWM signal to an output of the power switch with high accuracy.

However, fluctuations in supply voltage supplied to the power switch disadvantageously cause distortion in an output signal. If a voltage of a certain value is always supplied to the power switch through a constant voltage circuit, distortion in an output signal may be reduced, however, the power switch consumes relatively great power, and power loss in the constant voltage circuit for supplying a voltage of a certain value to the power switch thus increases, which causes another problem in that power amplification cannot be performed on an audio signal with high efficiency and low power loss.

SUMMARY OF THE INVENTION

An object of the present invention is to provide a class D amplifier having a simple circuit configuration, capable of reducing distortion in an audio signal with high accuracy, that is, a class D amplifier of high efficiency in which distortion in an output signal due to fluctuations in supply voltage supplied to a power switch is greatly reduced as compared to a conventional amplifier and which can be used without any problem even when the supply voltage varies in a relatively wide range.

According to a first aspect of the invention, the class D amplifier includes a pulse modulator, a correction circuit and a power switch. The pulse modulator generates a pulse modulated signal. The correction circuit corrects a feedback signal input thereto by feedback in reference to the pulse modulated signal. The power switch generates a voltage signal on the basis of a correction signal output from the correction circuit. The feedback signal is generated on the basis of the voltage signal. The correction circuit includes a first integrator, a second integrator and a comparator. The first integrator performs integration on the basis of the pulse modulated signal. The second integrator performs integration on the basis of the feedback signal. The comparator compares a first integrated signal output from the first integrator and a second integrated signal output from the second integrator, thereby generating the correction signal in correspondence with the result of comparison.

The pulse modulated signal and feedback signal can be converted into integrated signals with the low frequency component being accentuated in the first and second integrators, respectively. The comparator compares the integrated signals, and generates and outputs the correction signal to the correction circuit as the feedback signal. Therefore, distortion in an audio signal occurring in the power switch can be corrected with a pulse signal being removed (i.e., the low frequency component being accentuated). This can prevent the circuit operation from being constrained by a remaining pulse component. That is, it can be prevented that such remaining pulse component, entering into a non-linear region of the correction circuit and being distorted therein, causes distortion in an error signal and hindrance to proper correction. Further, the correction signal can directly be generated in the correction circuit based on an error between the pulse modulated signal and feedback signal, allowing the circuit configuration to be simplified as a whole.

According to a second aspect of the invention, the class D amplifier includes a pulse modulator, a correction circuit and a power switch. The pulse modulator generates a pulse modulated signal. The correction circuit corrects a feedback signal input thereto by feedback in reference to the pulse modulated signal. The power switch generates a voltage signal on the basis of a correction signal output from the correction circuit. The feedback signal is generated on the basis of the voltage signal. The correction circuit includes a first integrator, a second integrator, a first subtracter, a third integrator, a reverser and a comparator. The first integrator performs integration on the basis of the pulse modulated signal. The second integrator performs integration on the basis of the feedback signal. The first subtracter obtains a difference between a first integrated signal output from the first integrator and a second integrated signal output from the second integrator. The third integrator integrates a first differential signal output from the first subtracter. The reverser reverses a third integrated signal output from the third integrator. The comparator compares the first differential signal and the third integrated signal as reversed by the reverser, thereby generating the correction signal in correspondence with the result of comparison.

The low frequency component of the first differential signal (i.e., distortion in an audio signal) can further be accentuated in the third integrator and then reversed by the reverser, whereby the comparator can provide the first differential signal with a component resulting from the distortion in the audio signal and generate the correction signal with the distortion in the audio signal being further accentuated. This allows correction to be performed with higher accuracy than in the class D amplifier of the first aspect.

According to a third aspect of the invention, the class D amplifier includes a power switch, a correction circuit and an arithmetic unit. The power switch switches on/off a power supply supplying a supply voltage in response to a pulse width modulated signal. The correction circuit corrects a pulse width of the pulse width modulated signal to be input to the power switch in accordance with an amplitude of a feedback signal generated from an output of the power switch. The arithmetic unit adjusts the amplitude of the feedback signal to be input to the correction circuit in accordance with a value of the supply voltage.

The class D amplifier achieves high efficiency, in which distortion in an output signal resulting from fluctuations in the supply voltage supplied to the power switch is significantly reduced as compared to a conventional class D amplifier, and an audio signal output level when no distortion occurs is reduced little even when the supply voltage fluctuates within a relatively wide range.

According to a fourth aspect of the invention, the class D amplifier includes a power switch and a correction circuit. The power switch switches on/off a power supply supplying a supply voltage in response to a pulse width modulated signal. The correction circuit corrects a pulse width of the pulse width modulated signal to be input to the power switch in accordance with an amplitude of a feedback signal generated from an output of the power switch. The correction circuit includes a first integrator, a second integrator and a comparator. The first integrator integrates the pulse width modulated signal. The second integrator integrates a difference between the feedback signal and a reference voltage generated on the basis of a dc component of the supply voltage. The comparator compares outputs of the first and second integrators. An output of the comparator is input to the power switch.

The class D amplifier achieves high efficiency, in which distortion in an output signal resulting from fluctuations in the supply voltage supplied to the power switch is significantly reduced as compared to a conventional class D amplifier, and an audio signal output level when no distortion occurs is reduced little even when the supply voltage fluctuates within a relatively wide range.

According to a fifth aspect of the invention, the class D amplifier includes a power switch, a correction circuit, a level reference signal generator and a level adjusting circuit. The power switch switches on/off a power supply supplying a supply voltage in response to a pulse width modulated signal. The correction circuit corrects a pulse width of the pulse width modulated signal to be input to the power switch in accordance with an amplitude of an output signal of the power switch. The level reference signal generator generates a level reference signal from the supply voltage. The level adjusting circuit adjusts an amplitude of the pulse width modulated signal to be input to the correction circuit in accordance with a value of the level reference signal.

The class D amplifier achieves high efficiency, in which distortion in an output signal resulting from fluctuations in the supply voltage supplied to the power switch is significantly reduced as compared to a conventional class D amplifier, and which can be used without problems even when the supply voltage fluctuates within a relatively wide range.

According to sixth aspect of the invention, the class D amplifier includes a pulse modulator, a power switch, a correction circuit, a level reference signal generator, a level adjusting circuit, a level adjusting circuit and a modulation index adjusting circuit. The pulse modulator modulates a pulse width of an input signal to output a pulse width modulated signal. The power switch switches on/off a power supply supplying a supply voltage in response to the pulse width modulated signal. The correction circuit corrects a pulse width of the pulse width modulated signal to be input to the power switch in accordance with an amplitude of output signal of the power switch. The level reference signal generator generates a level reference signal from the supply voltage. The modulation index control signal generator generates a modulation index control signal from the supply voltage. The level adjusting circuit for adjusting an amplitude of the pulse width modulated signal to be input to the correction circuit in accordance with a value of the level reference signal. The modulation index adjusting circuit adjusts a modulation index in the pulse modulator in accordance with a value of the modulation index control signal.

The class D amplifier achieves high efficiency, in which distortion in an output signal resulting from fluctuations in the supply voltage supplied to the power switch is significantly reduced as compared to a conventional class D amplifier, and which can be used without problems even when the supply voltage fluctuates within a relatively wide range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates signal waveforms in the steady state at respective points in the correction circuit according to the first preferred embodiment when no distortion occurs;

FIGS. 4A and 4B illustrate a first type of distortion;

FIGS. 5A and 5B illustrate a second type of distortion;

FIGS. 6A and 6B illustrate a third type of distortion;

FIGS. 7A and 7B illustrate a fourth type of distortion;

FIG. 8 illustrates signal waveforms in the steady state at respective points in the correction circuit according to the first preferred embodiment when the first type of distortion occurs;

FIG. 15 illustrates signal waveforms in the steady state at respective points in the correction circuit according to the second preferred embodiment when the first type of distortion occurs;

FIG. 16 illustrates signal waveforms in the steady state at respective points in the correction circuit according to the second preferred embodiment when the second type of distortion occurs;

DESCRIPTION OF THE PREFERRED EMBODIMENTS

First Preferred Embodiment

A correction circuit included in a class D amplifier according to the present embodiment is capable of integrating a pulse modulated signal output from a pulse modulator and a feedback signal output from a power switch, comparing integrated signals in a comparator using the pulse modulated signal as a reference for outputting an output signal corresponding to the result of comparison to the power switch, and finally correcting signal distortion occurring in the power switch.

Figure 1:
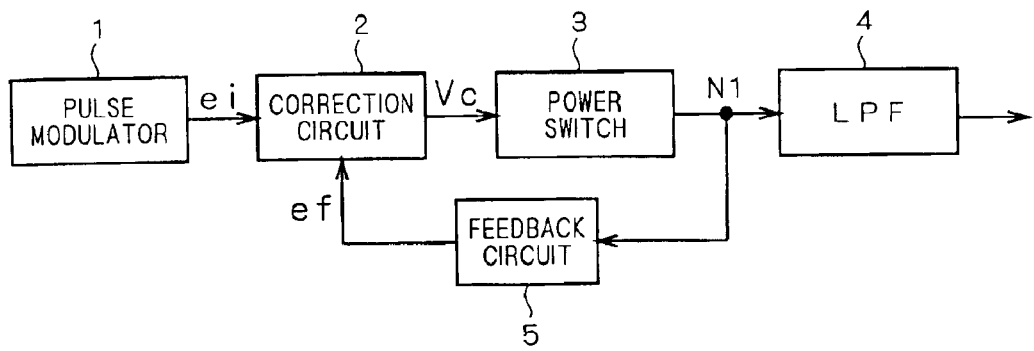
FIG. 1 is a block diagram illustrating the circuit configuration of a class D amplifier according to the present invention.

FIG. 1 is a block diagram illustrating the circuit configuration of the class D amplifier according to the present invention including the correction circuit.

The class D amplifier illustrated in FIG. 1 includes a pulse modulator 1, a correction circuit 2, a power switch 3 and a low-pass filter (LPF) 4 connected in series to each other. A signal is transmitted from the pulse modulator 1 to the LPF 4. A feedback circuit 5 is provided between a node N1 and the correction circuit 2 such that part of a signal output from the power switch 3 is fed back to the correction circuit 2.

The correction circuit 2 has two input terminals, one of which receives a signal from the pulse modulator 1 and the other one receives a feedback signal from the feedback circuit 5.

In the aforementioned configuration, the respective components operate as will be described below.

The pulse modulator 1 converts a digital or analog audio signal to a pulse modulated signal such as a binary pulse width modulated signal or binary pulse number modulated signal, for outputting such pulse modulated signal.

The correction circuit 2 receives the pulse modulated signal and the feedback signal from the feedback circuit 5 and corrects a distortion factor in the power switch 3 contained in the feedback signal using the pulse modulated signal as a reference, for outputting the pulse modulated signal as corrected.

The power switch 3, formed by a switching device connected to a power supply and a switching device connected to a ground (or negative power supply), performs power amplification by switching between the power source and the ground in accordance with the pulse modulated signal subjected to correction of the distortion factor output from the correction circuit 2, for enabling power supply to a load connected to the output of the amplifier.

The LPF 4 removes a high frequency component from a power-amplified signal output from the power switch 3, thereby outputting a demodulated audio signal.

At last, the feedback circuit 5 performs level adjustment of the amplitude of the power-amplified signal output from the power switch 3, and supplies the level-adjusted signal to the other input terminal of the correction circuit 2. In the case where no distortion occurs in the signal amplitude in the power switch 3, the aforementioned level adjustment of the signal amplitude is to attenuate the amplitude of the signal power-amplified in the power switch 3 to the same level as the amplitude of the pulse modulated signal output from the pulse modulator 1 by a fixed attenuation gain.

Figure 2:
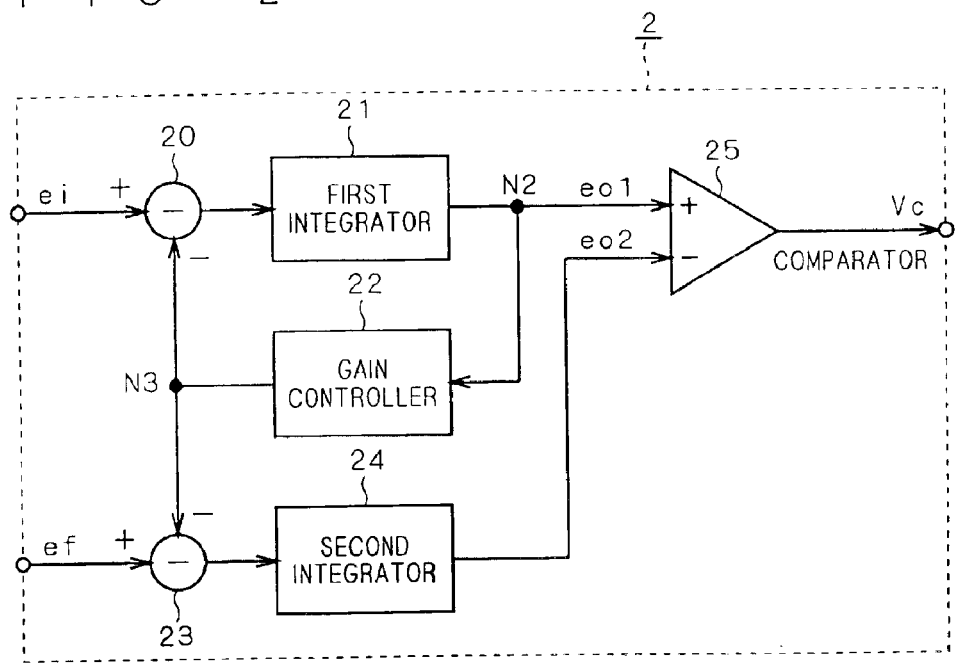
FIG. 2 is a block diagram illustrating the inner configuration of a correction circuit according to a first preferred embodiment of the invention.

FIG. 2 is a block diagram illustrating the inner configuration of the correction circuit 2 carrying out correction in the class D amplifier according to the invention.

The configuration of the correction circuit 2 illustrated in FIG. 2 will specifically be described.

A subtracter 20 has its output terminal connected to the input terminal of a first integrator 21, and the first integrator 21 has its output terminal connected to one of the input terminals, i.e., the "+" input terminal of a comparator 25.

A subtracter 23 has its output terminal connected to the input terminal of a second integrator 24, and the second integrator 24 has its output terminal connected to the other terminal, i.e., the "−" terminal of the comparator 25.

Further, the first integrator 21 has its output terminal also connected to the input terminal of a gain controller 22 through a node N2 provided between the first integrator 21 and comparator 25. The gain controller 22 has its output terminal connected to the "−" terminals of the subtracter 20 and 23, respectively through a node N3.

The subtracter 20 has its "+" terminal connected to the output terminal of the pulse modulator 1, and the subtracter 23 has its "+" terminal connected to the output terminal of the feedback circuit 5. The comparator 25 has its output terminal connected to the input terminal of the power switch 3.

In the above-described configuration, the subtracter 20, first integrator 21 and gain controller 22 form an integrating circuit providing negative feedback through the gain controller 22. In this integrating circuit, the subtracter 20 obtains a difference between the pulse modulated signal from the pulse modulator 1 and an output signal from the gain controller 22 to generate a first differential signal, and the first integrator 21 integrates the first differential signal. That is, the first integrator 21 integrates the first differential signal based on the pulse modulated signal to accentuate a low frequency component contained in the pulse modulated signal as well as to appropriately suppress a low frequency gain by negative feedback through the gain controller 22, for preventing an integrated signal from the first integrator 21 from exceeding an operation range of the circuit.

Further, an integrating circuit formed by the subtracter 23 and second integrator 24 subtracts an output signal of the gain controller 22 from the feedback signal of the feedback circuit 5 to generate a second differential signal, and integrates the second differential signal. That is, the second integrator 24 integrates the second differential signal based on the feedback signal to accentuate a low frequency component contained in the feedback signal while the subtracter 23 subtracts the output signal of the gain controller 22 from the feedback signal of the feedback circuit 5 to reduce a low frequency component, thereby preventing an integrated signal of the second integrator 24 from exceeding an operating range of the circuit.

The comparator 25 compares the waveform of the integrated signal from the first integrator 21 and that of the integrated signal from the second integrator 24 to output the result of comparison as the correction signal Vc which is a binary pulse signal.

Hereinafter, the operation of the comparator 25 will be described using mathematic expressions.

First, representing the pulse modulated signal output from the pulse modulator 1 by ei and the integrated signal output from the first integrator 21 by eo1, the integrated signal eo1 can be expressed as follows:

$$eo1 = G1 \int (ei - Gf \cdot eo1)dt \qquad (1)$$

$$= G1 \int ei \cdot dt - Gf \cdot G1 \int eo1 \cdot dt$$

where G1 is a constant for gain of the first integrator 21, and Gf is a constant for gain of the gain controller 22.

Further, representing the feedback signal output from the feedback circuit 5 by ef and the integrated signal output from the second integrator 24 by eo2, the integrated signal eo2 can be expressed as follows:

$$eo2 = G2 \int (ef - Gf \cdot eo1)dt \qquad (2)$$

$$= G2 \int ef \cdot dt - Gf \cdot G2 \int eo1 \cdot dt$$

where G2 is a constant for gain of the second integrator 24.

In the expressions (1) and (2), low frequency components of the integrated signals eo1 and eo2 are each appropriately reduced by the second term (containing the constant Gf for gain) of the right side.

The correction signal Vc output from the comparator 25 is generated as a binary pulse of "H" or "L" (i.e., "0" or "1") in accordance with the value of (eo1−eo2).

For instance, when the value of (eo1−eo2) is positive, the correction signal Vc of "H" is output from the comparator 25 as a binary pulse signal. Then, the correction signal Vc of "H" causes a signal of the same phase to be fed back through the power switch 3 and feedback circuit 5. Thus, the feedback signal ef is brought into the "H" level and increases the value of the integrated signal eo2. Therefore, the value of (eo1−eo2) is reduced and converges to approximately zero in the steady state.

On the other hand, when the value of (eo1−eo2) is negative, the correction signal Vc of "L" is output from the comparator 25 as a binary pulse signal. Then, the correction signal Vc of "L" causes a signal of the same phase to be fed back through the power switch 3 and feedback circuit 5. Thus, the feedback signal ef is brought into the "L" level and reduces the value of the integrated signal eo2. Therefore, the value of (eo1–eo2) is increased and converges to approximately zero in the steady state.

That is to say, the following expression obtained from the expressions (1) and (2):

$$G1 \int ei \cdot dt - G2 \int ef \cdot dt + Gf \cdot (G2 - G1) \int eo1 \cdot dt \quad (3)$$

is approximated to zero.

Here, provided that the constants G1 and G2, which are not necessarily be equal to each other, are almost equal and indicated as a constant G, it is seen that the expression (3) is approximately expressed as follows:

$$G(\int ei\, dt - \int ef\, dt) = 0 \quad (4)$$

This shows that the correction circuit 2 of the aforementioned configuration serves to equalize the low frequency component of the input signal ei and that of the feedback signal ef. Thus, the correction signal Vc output from the comparator 25 is generated so as to reduce the difference between the low frequency component of the pulse modulated signal ei and that of the feedback signal ef, i.e., distortion in an audio signal.

As described, distortion in an audio signal is reduced by correction. As can be seen from the foregoing description, distortion is reduced within a range of $Gf \cdot (G2-G1) \int eo1\, dt$ even when the constants G1 and G2 have different values from each other. However, provided that the constants G1 and G2 have equal values, reduction in distortion (correction of distortion) can be performed with higher accuracy.

Next, the state of signal waveforms at respective points in the correction circuit 2 will be described.

First, a case in which no distortion occurs in the power switch 3 will be described. FIG. 3 illustrates signal waveforms in the steady state at respective points in the correction circuit 2 in this case. The horizontal axis represents time and the vertical axis represents voltage value.

In FIG. 3, reference numeral 30 represents a pulse waveform of the pulse modulated signal ei output from the pulse modulator 1 and input to the correction circuit 2, and 31 represents an integrated waveform of the integrated signal eo1 generated in the first integrator 21 based on the pulse waveform 30.

Reference numeral 34 represents a pulse waveform of the feedback signal ef output from the feedback circuit 5 and input to the correction circuit 2, and 32 represents an integrated waveform of the integrated signal eo2 generated in the second integrator 24 based on the pulse waveform 34.

Reference numeral 33 represents a pulse waveform of the correction signal Vc generated in the comparator 25 as a binary pulse of "H" or "L" (i.e., "0" or "1") in accordance with the difference between the integrated waveforms 31 and 32. Specifically, when the waveform 31 is higher than the waveform 32, a pulse of "H" (or "1") is generated, while a pulse of "L" (or "0") is generated when the waveform 31 is lower than the waveform 32.

The pulse waveform 30 shall have an amplitude ranging between approximately zero and Vsig. Provided that voltage supplied to the power switch 3 from the constant-voltage power supply is Vpow and a fixed attenuation gain in the feedback circuit 5 is 1/K, the pulse waveform 34 output from the feedback circuit 5 has an amplitude ranging between approximately zero and Vpow/K, and the feedback circuit is set in such a manner that the amplitude of the pulse waveform 34 is equal to the amplitude of the pulse waveform 30 output from the pulse modulator 1 (i.e., Vpow/K= Vsig).

In the case where the pulse waveforms 30 and 34 are in the state shown in FIG. 3 and the first integrator 21 and second integrator 24 operate on the basis of approximately Vsig/2 by the action of the gain controller 22 and the like, the integrated waveforms 31 and 32 are generated as shown in FIG. 3, and the correction signal Vc output from the comparator 25 becomes like the pulse waveform 33. Here, in the steady state, the pulse waveform 34 has delay time δ caused mainly by the power switch 3 with respect to the pulse waveform 33 output from the comparator 25.

That is, FIG. 3 shows that, when the correction circuit 2 operates normally in the steady state causing no distortion in the power switch 3, the pulse waveform 34 which is the feedback signal ef becomes a similar waveform having the delay time δ with the pulse waveform 30 which is the pulse modulated signal ei, which means the low frequency components of both the pulse waveforms 30 and 34 are equal to each other and an audio signal is transmitted normally without distortion.

The feedback signal ef actually contains distortion in waveform resulting mainly from the power switch 3. The distortion deforms the waveform of the feedback signal ef, causing the low frequency component of the feedback signal ef to have a difference from the low frequency component of the pulse modulated signal ei.

Therefore, description will now be made on how the waveforms change at respective points in the correction circuit 2 of the class D amplifier according to the present embodiment in the steady state with a normal correction operation performed by the correction circuit 2 in the case where four patterns of waveform distortion illustrated in FIGS. 4A to 7B are caused by the power switch 3. In FIGS. 4A to 7B, the horizontal axis represents time and the vertical axis represents voltage value. The four patterns of waveform distortion or combination of these patterns can represent any distortion which actually occurs.

FIGS. 4A and 4B illustrate the case in which falling delay of the power switch 3 causes the width of a pulse output from the power switch 3 to be greater by te1 than the width of a pulse of the correction signal Vc yet to be input to the power switch 3 (hereinafter referred to as a first type of distortion).

FIG. 4A shows the pulse waveform of the correction signal Vc output from the comparator 25 before distortion occurs, and FIG. 4B shows the pulse waveform of an output signal from the power switch 3 after the correction signal Vc shown in FIG. 4A is input to the power switch 3, where the first type of distortion occurs.

FIGS. 5A and 5B illustrate the case in which rising delay of the power switch 3 causes the width of a pulse output from the power switch 3 to be smaller by te2 than the width of a pulse of the correction signal Vc yet to be input to the power switch 3 (hereinafter referred to as a second type of distortion).

FIG. 5A shows the pulse waveform of the correction signal Vc output from the comparator 25 before distortion occurs, and FIG. 5B shows the pulse waveform of an output signal from the power switch 3 after the correction signal Vc shown in FIG. 5A is input to the power switch 3, where the second type of distortion occurs.

FIGS. 6A and 6B illustrate the case in which fluctuations in the supply voltage in the power switch 3 causes the width of a pulse output from the power switch 3 to be greater by ΔV1 than the reference voltage value Vpow supplied to the power switch 3 from the constant-voltage power supply (hereinafter referred to as a third type of distortion).

FIG. 6A shows the pulse waveform of the correction signal Vc output from the comparator 25 before distortion occurs, and FIG. 6B shows the pulse waveform of an output signal from the power switch 3 after the correction signal Vc shown in FIG. 6A is input to the power switch 3, where the third type of distortion occurs.

FIGS. 7A and 7B illustrate the case in which fluctuations in the supply voltage in the power switch 3 cause the width of a pulse output from the power switch 3 to be smaller by ΔV2 than the reference voltage value Vpow supplied to the power switch 3 from the constant-voltage power supply (hereinafter referred to as a fourth type of distortion).

FIG. 7A shows the pulse waveform of the correction signal Vc output from the comparator 25 before distortion occurs, and FIG. 7B shows the pulse waveform of an output signal from the power switch 3 after the correction signal Vc shown in FIG. 7A is input to the power switch 3, where the fourth type of distortion occurs.

The reference character δ represents the delay time which is created in the power switch 3 in FIGS. 4A through 7B.

In the first and third patterns of distortion, distortion occurs in the low frequency components as increase in the signal level. In the second and fourth patterns of distortion, distortion occurs in the low frequency components as reduction in the signal level.

Description will be made below on how the waveforms change at respective points in the correction circuit 2 in the steady state in the case of the aforementioned first to fourth patterns of distortion.

First, the first type of distortion will be described. FIG. 8 illustrates the waveforms at respective points in the correction circuit 2 which is brought into the steady state by performing correction at the occurrence of the first type of distortion. The horizontal axis represents time and the vertical axis represents voltage value.

In FIG. 8, the pulse waveform 30 and integrated waveform 31 are the same as those shown in FIG. 3, repeated explanation of which is thus omitted here.

Reference numeral 34a represents a pulse waveform of the feedback signal ef output from the feedback circuit 5 and input to the correction circuit 2 which is brought into the steady state by correction performed by the class D amplifier of the present embodiment at the occurrence of the first type of distortion in the power switch 3, and 32a represents an integrated waveform of the integrated signal eo2 generated in the second integrator 24 based on the pulse waveform 34a.

Reference numeral 33a represents a pulse waveform of the correction signal Vc generated in the comparator 25 as a binary pulse of "H" or "L" (i.e., "0" or "1") in accordance with the difference between the integrated waveforms 31 and 32a. Specifically, when the waveform 31 is higher than the waveform 32a, a pulse of "H" (or "1") is generated, while a pulse of "L" (or "0") is generated when the waveform 31 is lower than the waveform 32a.

The pulse waveform 30 shall have an amplitude ranging between approximately zero and Vsig. No distortion occurs in the amplitude in the first type of distortion. Therefore, provided that voltage supplied to the power switch 3 from the constant-voltage power supply is Vpow and a fixed attenuation gain in the feedback circuit 5 is 1/K, the pulse waveform 34a output from the feedback circuit 5 has an amplitude ranging between approximately zero and Vpow/K and becomes equal to the amplitude of the pulse waveform 30 output from the pulse modulator 1 by the action of the feedback circuit 5 (i.e., Vpow/K=Vsig).

When correction in the correction circuit 2 is performed normally, the pulse area of the pulse waveform 34a corresponding to one cycle of the frequency in the steady state becomes equal to the pulse area of the pulse waveform 30 corresponding to one cycle of the frequency.

In the case where the pulse waveforms 30 and 34a are as shown in FIG. 8 and where the first and second integrators 21 and 24 operate on the basis of approximately Vsig/2 by the action of the gain controller 22 and the like, the integrated waveforms 31 and 32a are formed as shown in FIG. 8.

In the first type of distortion in the power switch 3 (FIGS. 4A, 4B), the average value of the integrated waveform 32a is greater than that of the integrated waveform 32 generated in the case where no distortion occurs as shown in FIG. 3. Thus, time periods during which the integrated waveform 31 exceeds the integrated waveform 32a are shortened as compared to the case where no distortion occurs as shown in FIG. 3.

Therefore, the correction signal Vc output from the comparator 25 on the basis of the difference between the integrated waveforms 31 and 32a has the pulse waveform 33a.

As shown in FIG. 8, by the normal action of the comparator 25, the pulse width of the pulse waveform 33a is formed to be smaller than the pulse width of the pulse waveform 34a by te1 in response to the first type of distortion (that is, time periods during which the pulse waveform 33a is in the "H" level are shortened as compared to the case where no distortion occurs as shown in FIG. 3).

Consequently, even when the pulse waveform 33a of pulse width as shown in FIG. 8 is fed back and input again to the power switch 3, causing the first type of distortion to occur in the power switch 3, which causes the pulse width to be increased by te1, the pulse width of the pulse waveform 34a becomes equal to that of the waveform 30. FIG. 8 also shows that the delay time δ resulting mainly from the power switch 3 arises between the pulse waveforms 33a and 34a.

As described, in the case where the first type of distortion occurs in the power switch 3, the class D amplifier of the present embodiment sets the pulse width of the pulse waveform 33a output from the comparator 25 to be smaller than the pulse width of the pulse waveform 30 by te1 in response to the first type of distortion, thereby correcting the first type of distortion in the power switch 3 to make the pulse width of the pulse waveform 34a almost equal to that of the pulse waveform 30 in the steady state, i.e., to make the pulse area of the pulse waveform 34a corresponding to one cycle of the frequency almost equal to the pulse area of the pulse waveform 30 corresponding to one cycle of the frequency. This is to make the low frequency component of the feedback signal ef and that of the pulse modulated signal ei almost equal to each other, which means these signals have no error therebetween, i.e., distortion in an audio signal is corrected.

Figure 9:
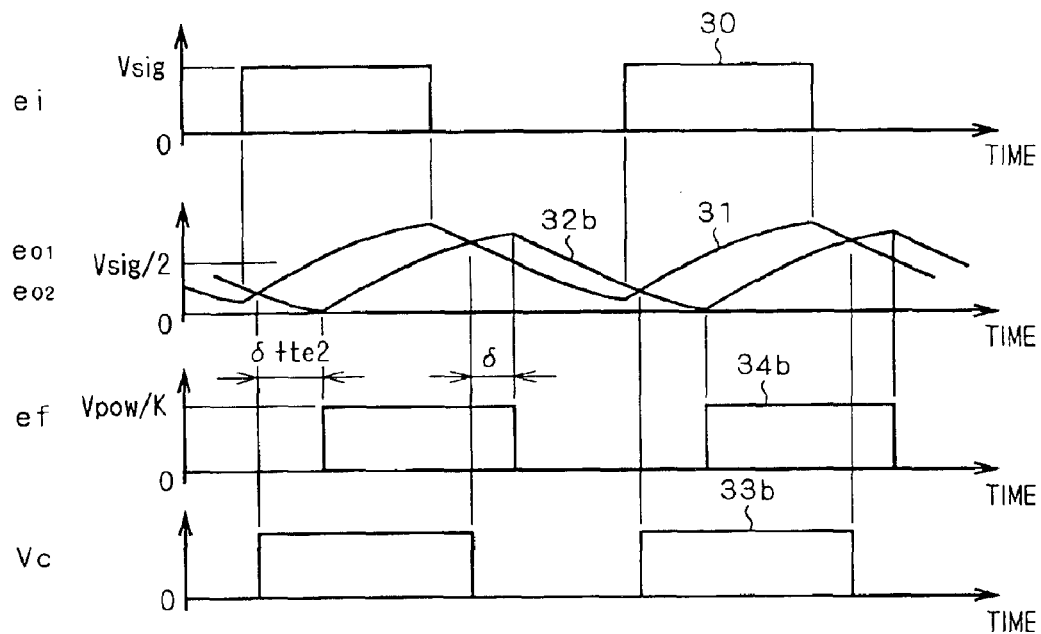
FIG. 9 illustrates signal waveforms in the steady state at respective points in the correction circuit according to the first preferred embodiment when the second type of distortion occurs.

Next, the second type of distortion will be described. FIG. 9 illustrates the waveforms at respective points in the correction circuit 2 which is brought into the steady state by performing correction at the occurrence of the second type of distortion. The horizontal axis represents time and the vertical axis represents voltage value.

In FIG. 9, the pulse waveform 30 and integrated waveform 31 are the same as those shown in FIG. 8, repeated explanation of which is thus omitted here.

Reference numeral 34b represents a pulse waveform of the feedback signal ef output from the feedback circuit 5 and input to the correction circuit 2 which is brought into the steady state by correction performed by the class D amplifier of the present embodiment at the occurrence of the second type of distortion in the power switch 3, and 32b represents an integrated waveform of the integrated signal eo2 generated in the second integrator 24 based on the pulse waveform 34b.

Reference numeral 33b represents a pulse waveform of the correction signal Vc generated in the comparator 25 as a binary pulse of "H" or "L" (i.e., "0" or "1") in accordance with the difference between the integrated waveforms 31 and 32b. Specifically, when the waveform 31 is higher than the waveform 32b, a pulse of "H" (or "1") is generated, while a pulse of "L" (or "0") is generated when the waveform 31 is lower than the waveform 32b.

The pulse waveform 30 shall have an amplitude ranging between approximately zero and Vsig. No distortion occurs in the amplitude in the second type of distortion. Therefore, provided that voltage supplied to the power switch 3 from the constant-voltage power supply is Vpow and a fixed attenuation gain in the feedback circuit 5 is 1/K, the pulse waveform 34b output from the feedback circuit 5 has an amplitude ranging between approximately zero and Vpow/K and becomes equal to the amplitude of the pulse waveform 30 output from the pulse modulator 1 by the action of the feedback circuit 5 (i.e., Vpow/K=Vsig).

When correction in the correction circuit 2 is performed normally, the pulse area of the pulse waveform 34b corresponding to one cycle of the frequency in the steady state becomes equal to the pulse area of the pulse waveform 30 corresponding to one cycle of the frequency.

In the case where the pulse waveforms 30 and 34b are as shown in FIG. 9 and where the first and second integrators 21 and 24 operate on the basis of approximately Vsig/2 by the action of the gain controller 22 and the like, the integrated waveforms 31 and 32b are formed as shown in FIG. 9.

In the second type of distortion in the power switch 3 (FIGS. 5A, 5B), the average value of the integrated waveform 32b is smaller than that of the integrated waveform 32 generated in the case where no distortion occurs as shown in FIG. 3. Thus, time periods during which the integrated waveform 31 exceeds the integrated waveform 32b are extended as compared to the case where no distortion occurs as shown in FIG. 3.

Therefore, the correction signal Vc output from the comparator 25 on the basis of the difference between the integrated waveforms 31 and 32b has the pulse waveform 33b.

As shown in FIG. 9, by the normal action of the comparator 25, the pulse width of the pulse waveform 33b is formed to be greater than the pulse width of the pulse waveform 34b by te2 in response to the second type of distortion (that is, time periods during which the pulse waveform 33b is in the "H" level are extended as compared to the case where no distortion occurs as shown in FIG. 3).

Consequently, when the pulse waveform 33b of pulse width as shown in FIG. 9 is fed back and input again to the power switch 3, causing the second type of distortion to occur in the power switch 3, which causes the pulse width to be increased by te2, the pulse width of the pulse waveform 34b becomes equal to that of the waveform 30. FIG. 9 also shows that the delay time 6 resulting mainly from the power switch 3 arises between the pulse waveforms 33b and 34b.

As described, in the case where the second type of distortion occurs in the power switch 3, the class D amplifier of the present embodiment sets the pulse width of the pulse waveform 33b output from the comparator 25 to be greater than the pulse width of the pulse waveform 30 by te2 in response to the second type of distortion, thereby correcting the second type of distortion in the power switch 3 to make the pulse width of the pulse waveform 34b almost equal to that of the pulse waveform 30 in the steady state, i.e., to make the pulse area of the pulse waveform 34b corresponding to one cycle of the frequency almost equal to the pulse area of the pulse waveform 30 corresponding to one cycle of the frequency. This is to make the low frequency component of the feedback signal ef and that of the pulse modulated signal ei almost equal to each other, which means the signals have no error therebetween, i.e., distortion in an audio signal is corrected.

Figure 10:
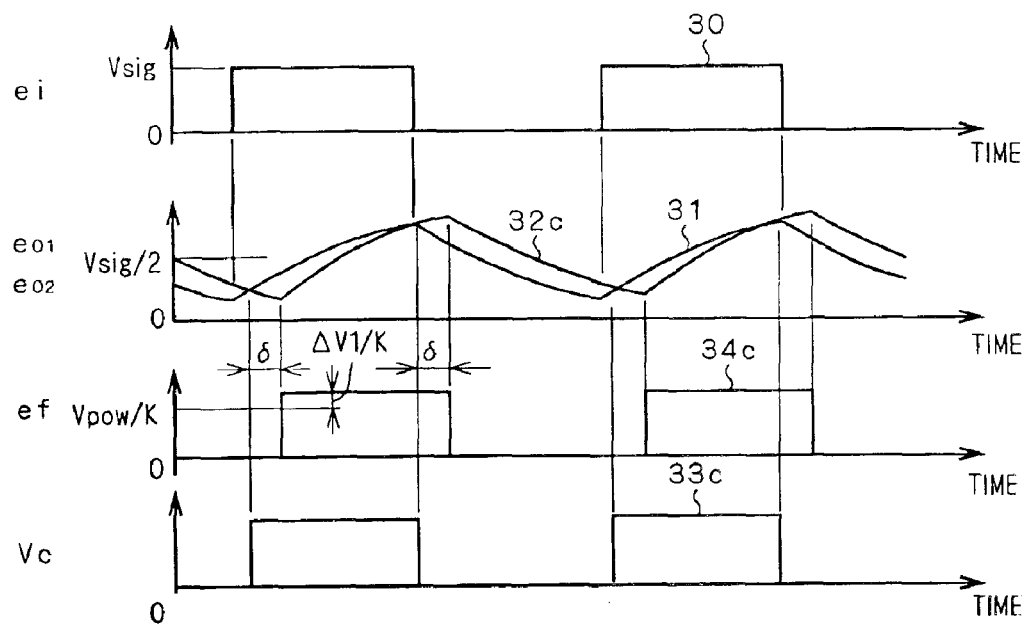
FIG. 10 illustrates signal waveforms in the steady state at respective points in the correction circuit according to the first preferred embodiment when the third type of distortion occurs.

Next, the third type of distortion will be described. FIG. 10 illustrates the waveforms at respective points in the correction circuit 2 which is brought into the steady state by performing correction at the occurrence of the third type of distortion. The horizontal axis represents time and the vertical axis represents voltage value.

In FIG. 10, the pulse waveform 30 and integrated waveform 31 are the same as those shown in FIG. 8, repeated explanation of which is thus omitted here.

Reference numeral 34c represents a pulse waveform of the feedback signal ef output from the feedback circuit 5 and input to the correction circuit 2 which is brought into the steady state by correction performed by the class D amplifier of the present embodiment at the occurrence of the third type of distortion in the power switch 3, and 32c represents an integrated waveform of the integrated signal eo2 generated in the second integrator 24 based on the pulse waveform 34c.

Reference numeral 33c represents a pulse waveform of the correction signal Vc generated in the comparator 25 as a binary pulse of "H" or "L" (i.e., "0" or "1") in accordance with the difference between the integrated waveforms 31 and 32c. Specifically, when the waveform 31 is higher than the waveform 32c, a pulse of "H" (or "1") is generated, while a pulse of "L" (or "0") is generated when the waveform 31 is lower than the waveform 32c.

The pulse waveform 30 shall have an amplitude ranging between approximately zero and Vsig. In the third type of distortion, distortion occurs in the amplitude by +ΔV1 with respect to the reference voltage value Vpow supplied to the power switch 3 from the constant-voltage power supply. Therefore, provided that a fixed attenuation gain in the feedback circuit 5 is 1/K, the pulse waveform 34c output from the feedback circuit 5 has an amplitude ranging between approximately zero and (Vpow+ΔV1)/K. Thus, the amplitude of the pulse waveform 34c is not equal to but greater than the amplitude of the pulse waveform 30 output from the pulse modulator 1 by ΔV1/K.

When correction in the correction circuit 2 is performed normally, the pulse area of the pulse waveform 34c corresponding to one cycle of the frequency in the steady state becomes equal to the pulse area of the pulse waveform 30 corresponding to one cycle of the frequency.

In the case where the pulse waveforms 30 and 34c are as shown in FIG. 10 and where the first and second integrators 21 and 24 operate on the basis of approximately Vsig/2 by the action of the gain controller 22 and the like, the integrated waveforms 31 and 32c are formed as shown in FIG. 10.

In the third type of distortion in the power switch 3 (FIGS. 6A, 6B), the average value of the integrated waveform 32c is greater than that of the integrated waveform 32 generated in the case where no distortion occurs as shown in FIG. 3.

Thus, time periods during which the integrated waveform 31 exceeds the integrated waveform 32c are shortened as compared to the case where no distortion occurs as shown in FIG. 3.

Therefore, the correction signal Vc output from the comparator 25 on the basis of the difference between the integrated waveforms 31 and 32c has the pulse waveform 33c.

As shown in FIG. 10, by the normal action of the comparator 25, the pulse width of the pulse waveform 33c is formed to be smaller than the pulse width of the pulse waveform 30 in response to the third type of distortion (i.e., increase in the amplitude by $\Delta V1$) (that is, time periods during which the pulse waveform 33c is in the "H" level are shortened as compared to the case where no distortion occurs as shown in FIG. 3).

Consequently, even when the pulse waveform 33c of pulse width as shown in FIG. 10 is fed back and input again to the power switch 3, causing the third type of distortion to occur in the power switch 3, which causes the amplitude to be increased as compared to a normal value by $\Delta V1$ with the pulse width remains unchanged, the pulse area of the pulse waveform 34c corresponding to one cycle of the frequency becomes almost equal to the pulse area of the pulse waveform 30 corresponding to one cycle of the frequency. FIG. 10 also shows that the delay time $\delta$ resulting mainly from the power switch 3 arises between the pulse waveforms 33c and 34c.

As described, in the case where the third type of distortion occurs in the power switch 3, the class D amplifier of the present embodiment sets the pulse width of the pulse waveform 33c output from the comparator 25 to be smaller than the pulse width of the pulse waveform 30 in response to the third type of distortion (i.e., increase in the amplitude by $\Delta V1$), thereby correcting the third type of distortion in the power switch 3 to make the pulse area of the pulse waveform 34c corresponding to one cycle of the frequency in the steady state almost equal to the pulse area of the pulse waveform 30 corresponding to one cycle of the frequency. This is to make the low frequency component of the feedback signal ef and that of the pulse modulated signal ei almost equal to each other, which means these signals have no error therebetween, i.e., distortion in an audio signal is corrected.

In this case, increase in the amplitude of the integrated waveform 32c is effective at reducing the pulse width of the correction signal Vc output from the comparator 25.

Figure 11:
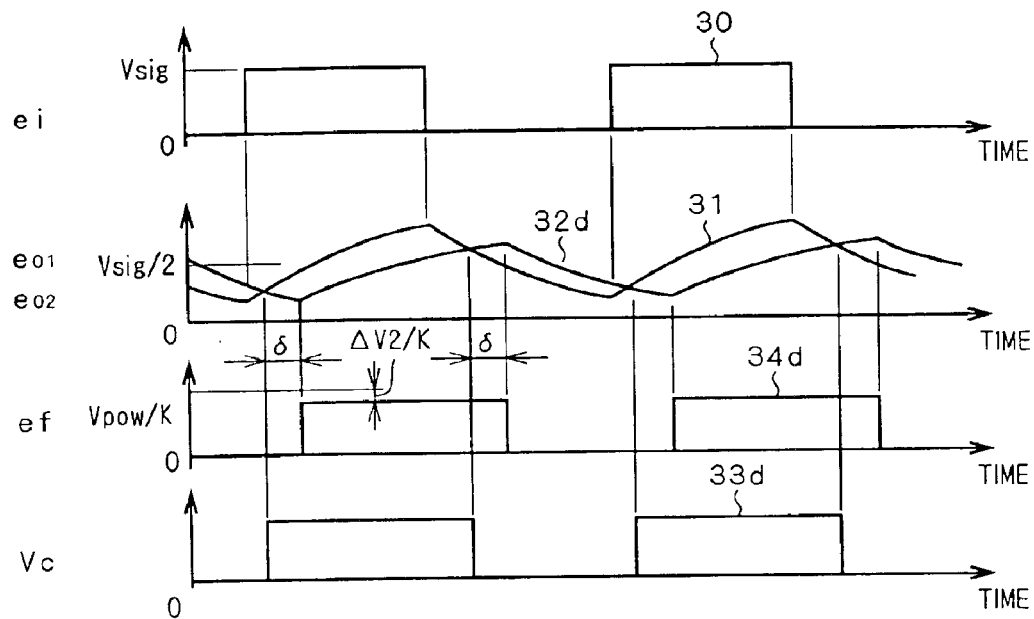
FIG. 11 illustrates signal waveforms in the steady state at respective points the correction circuit according to the first preferred embodiment when the fourth type of distortion occurs.

Next, the fourth type of distortion will be described. FIG. 11 illustrates the waveforms at respective points in the correction circuit 2 which is brought into the steady state by performing correction at the occurrence of the fourth type of distortion. The horizontal axis represents time and the vertical axis represents voltage value.

In FIG. 11, the pulse waveform 30 and integrated waveform 31 are the same as those shown in FIG. 8, repeated explanation of which is thus omitted here.

Reference numeral 34d represents a pulse waveform of the feedback signal ef output from the feedback circuit 5 and input to the correction circuit 2 which is brought into the steady state by correction performed by the class D amplifier of the present embodiment at the occurrence of the fourth type of distortion in the power switch 3, and 32d represents an integrated waveform of the integrated signal eo2 generated in the second integrator 24 based on the pulse waveform 34d.

Reference numeral 33d represents a pulse waveform of the correction signal Vc generated in the comparator 25 as a binary pulse of "H" or "L" (i.e., "0" or "1") in accordance with the difference between the integrated waveforms 31 and 32d. Specifically, when the waveform 31 is higher than the waveform 32d, a pulse of "H" (or "1") is generated, while a pulse of "L" (or "0") is generated when the waveform 31 is lower than the waveform 32d.

The pulse waveform 30 shall have an amplitude ranging between approximately zero and Vsig. In the fourth type of distortion, distortion occurs in the amplitude by $-\Delta V2$ with respect to the reference voltage value Vpow supplied to the power switch 3 from the constant-voltage power supply. Therefore, provided that a fixed attenuation gain in the feedback circuit 5 is 1/K, the pulse waveform 34d output from the feedback circuit 5 has an amplitude ranging between approximately zero and $(Vpow-\Delta V2)/K$. Thus, the amplitude of the pulse waveform 34d is not equal to but smaller than the amplitude of the pulse waveform 30 output from the pulse modulator 1 by $\Delta V2/K$.

When correction in the correction circuit 2 is performed normally, the pulse area of the pulse waveform 34d corresponding to one cycle of the frequency in the steady state becomes equal to the pulse area of the pulse waveform 30 corresponding to one cycle of the frequency.

In the case where the pulse waveforms 30 and 34d are as shown in FIG. 11 and where the first and second integrators 21 and 24 operate on the basis of approximately Vsig/2 by the action of the gain controller 22 and the like, the integrated waveforms 31 and 32d are formed as shown in FIG. 11.

In the fourth type of distortion in the power switch 3 (FIGS. 7A, 7B), the average value of the integrated waveform 32d is smaller than that of the integrated waveform 32 generated in the case where no distortion occurs as shown in FIG. 3. Thus, time periods during which the integrated waveform 31 exceeds the integrated waveform 32d are extended as compared to the case where no distortion occurs as shown in FIG. 3.

Therefore, the correction signal Vc output from the comparator 25 on the basis of the difference between the integrated waveforms 31 and 32d has the pulse waveform 33d.

As shown in FIG. 11, by the normal action of the comparator 25, the pulse width of the pulse waveform 33d is formed to be greater than the pulse width of the pulse waveform 30 in response to the fourth type of distortion (i.e., reduction in the amplitude by $\Delta V2$) (that is, time periods during which the pulse waveform 33d is in the "H" level are extended as compared to the case where no distortion occurs as shown in FIG. 3).

Consequently, even when the pulse waveform 33d of pulse width as shown in FIG. 11 is fed back and input again to the power switch 3, causing the fourth type of distortion to occur in the power switch 3, which causes the amplitude to be reduced as compared to a normal value by $\Delta V2$ with the pulse width remains unchanged, the pulse area of the pulse waveform 34d corresponding to one cycle of the frequency becomes almost equal to the pulse area of the pulse waveform 30 corresponding to one cycle of the frequency. FIG. 11 also shows that the delay time $\delta$ resulting mainly from the power switch 3 arises between the pulse waveforms 33d and 34d.

As described, in the case where the fourth type of distortion occurs in the power switch 3, the class D amplifier of the present embodiment sets the pulse width of the pulse waveform 33d output from the comparator 25 to be greater than the pulse width of the pulse waveform 30 in response to the fourth type of distortion (i.e., reduction in the amplitude by ΔV2), thereby correcting the fourth type of distortion in the power switch 3 to make the pulse area of the pulse waveform 34d corresponding to one cycle of the frequency in the steady state almost equal to the pulse area of the pulse waveform 30 corresponding to one cycle of the frequency. This is to make the low frequency component of the feedback signal ef and that of the pulse modulated signal ei almost equal to each other, which means these signals have no error therebetween, i.e., distortion in an audio signal is corrected.

In this case, increase in the amplitude of the integrated waveform 32d is effective at increasing the pulse width of the correction signal Vc output from the comparator 25.

The forgoing description has been directed to the process in which the correction circuit 2 according to the present embodiment transmits the pulse modulated signal ei to its output while performing correction based on feedback.

As described, the class D amplifier having the configuration shown in FIGS. 1 and 2 can reduce (or correct) distortion in an audio signal resulting mainly from the operation of the power switch 3.

In other words, the first integrator 21 integrates a signal based on the pulse modulated signal ei, the second integrator 24 integrates a signal based on the feedback signal ef, the comparator 25 compares both integrated signals in reference to the pulse modulated signal ei to generate a pulse signal in correspondence with the result of comparison, for outputting the pulse signal to the power switch 3, whereby the correction circuit 2 can correct factors resulting from distortion in an audio signal mainly caused by the power switch 3.

Further, in the present embodiment, the first and second integrators 21 and 24 generate a signal from which a high frequency component has been removed (i.e., a signal from which a pulse component has been removed), based on which the comparator 25 generates a correction signal. This can prevent the circuit operation from being constrained by a remaining pulse component as in the conventional technique. That is, it can be prevented that such remaining pulse component, entering into a non-linear region of the correction circuit 2 and being distorted therein, causes distortion in an error signal and hindrance to proper correction.

The conventional technique requires a trapezoidal wave of high accuracy to be formed and requires an error signal to be generated in the error handler 101 and a correction signal to be generated in the correction unit 102 based on the error signal, resulting in a complicated configuration. However, in the present invention, there is no necessity to form such trapezoidal wave and a correction signal is directly generated in the correction circuit 2 without the need to generate an error signal, allowing the circuit configuration to be simplified as a whole.

Further, the correction circuit of the present embodiment includes the gain controller 22 for controlling gain of the integrated waveform from the first integrator 21, the subtracter 20 subtracts an output signal of the gain controller 22 from the pulse modulated signal ei (obtains the difference between the signals), the subtracter 23 subtracts the output signal of the gain controller 22 from the feedback signal ef (obtains the difference between the signals), and the first and second integrators 21 and 24 respectively integrate differential signals generated by subtraction, so that a low frequency gain of integrated signals generated in the integrators 21 and 24 can appropriately be controlled, which can prevent the integrated signals from exceeding the operating range of the circuit.

Although an output signal from the first integrator 21 is input to the gain controller 22 which supplies an input signal in common to the subtracters 20 and 23 as shown in FIG. 2, an output signal from the second integrator 24 may be input to the gain controller 22 instead. Alternatively, a configuration may be employed in which two gain controllers 22 are provided, and an output signal from the first integrator 21 is input to one of the gain controllers 22 and a signal output from the one of the gain controllers 22 is input to the subtracter 20 while an output signal from the second integrator 24 is input to the other gain controller 22 and a signal output from the other gain controller 22 is input to the subtracter 23.

However, the configuration shown in FIG. 2 in which the output signal from the first integrator 21 is input to the gain controller 22 and the output signal from the gain controller 22 is input in common to the subtracters 20 and 23 prevents the gain of the second integrator 24 from being attenuated, allowing a correction operation to be performed with high accuracy.

Further, the class D amplifier of the present invention includes the feedback circuit 5 for attenuating the amplitude of an output signal from the power switch 3 and outputting the feedback signal ef to be input to the correction circuit 2. Thus, the amplitude of a signal amplified in the power switch 3 can be attenuated in the feedback circuit 5 to the same level as the amplitude of the pulse modulated signal ei output from the pulse modulator 1 in the case where no distortion in the amplitude occurs in the power switch 3, while a comparison operation in the correction circuit 2 can be simplified in the case where distortion in the amplitude occurs in the power switch 3. Therefore, the class D amplifier having the correction function can easily be achieved.

Specific Example of the First Preferred Embodiment

Figure 12:
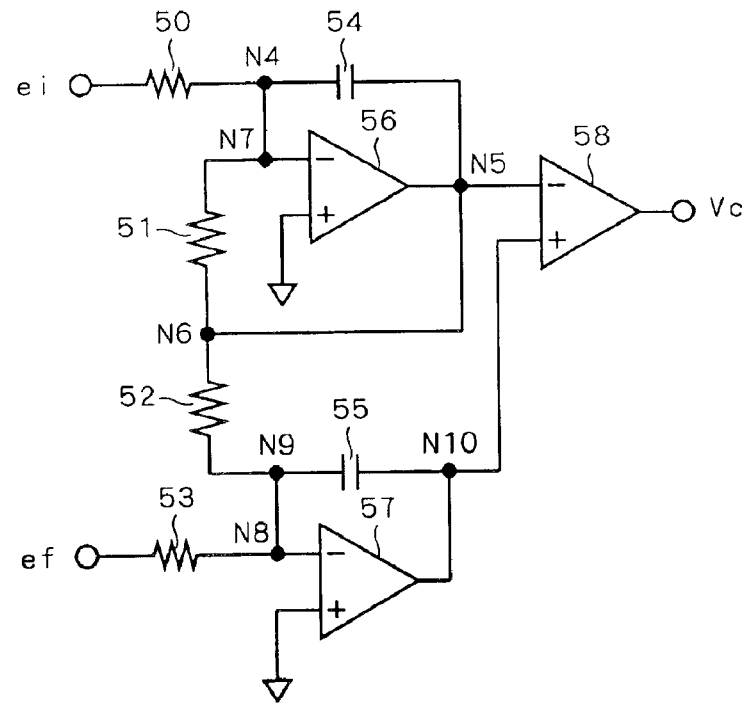
FIG. 12 illustrates a specific circuit configuration of the correction circuit according to the first preferred embodiment.

In the first preferred embodiment, a more specific configuration of the correction circuit 2 is shown in FIG. 12. The configuration shown in FIG. 12 will be described below.

In FIG. 12, the output terminal of the pulse modulator 1 shown in FIG. 1 is connected to one terminal of a resistor 50, while the other terminal of the resistor 50 is connected to a reverse ("−") input terminal of an operational amplifier 56 through nodes N4 and N7. Further, the output terminal of the operational amplifier 56 is branched off at a node N5 to provide negative feedback through a capacitor 54 and node N5 as well as to be connected to the "−" input terminal of a comparator 58 and a node N6.

One of the terminals of a resistor 52 and one of the terminals of a resistor 51 are connected to each other through the node N6. The other terminal of the resistor 51 is connected to the reverse ("−") input terminal of the operational amplifier 56 through the node N7. The other terminal of the resistor 52 is connected to the reverse ("−") input terminal of an operational amplifier 57 through nodes N8 and N9.

The output of the operational amplifier 57 is branched off at a node N10 to provide negative feedback through a capacitor 55 and node N10 as well as to be connected to the non-reverse ("+") input terminal of the comparator 58. The output terminal of the feedback circuit 5 shown in FIG. 1 is connected to the reverse ("−") terminal of the operational amplifier 57 through a resistor 53 and node N8.

The non-reverse ("+") terminal of the operational amplifier 56 and that of the operational amplifier 57 are connected to appropriate fixed potentials, respectively. The output terminal of the comparator 58 is connected to the input terminal of the power switch 3 shown in FIG. 1.

In the correction circuit 2 of the above-described configuration, supplying the pulse modulated signal ei input through the resistor 50 and the output signal of the operational amplifier 56 input through the resistor 51 combined together, to the reverse input terminal of the operational amplifier 56 corresponds to the operation of the subtracter 20 shown in FIG. 2. That is, reversing the output signal of the operational amplifier 56 with respect to the reverse input terminal corresponds to obtaining the difference between the pulse modulated signal ei and the signal from the gain controller 22 in the subtracter 20.

Moreover, accumulation of charges of a signal input to the reverse input terminal of the operational amplifier 56 in the capacitor 54 corresponds to the function of the first integrator 21 shown in FIG. 2. Further, adjusting the resistance ratio between the resistors 50 and 51 corresponds to the function of the gain controller 22 shown in FIG. 2.

On the other hand, supplying the feedback signal ef input through the resistor 53 and the output signal of the operational amplifier 56 input through the resistor 52 combined together, to the reverse input terminal of the operational amplifier 57 corresponds to the operation of the subtracter 23 shown in FIG. 2. That is, reversing the output signal of the operational amplifier 57 with respect to the reverse input terminal corresponds to obtaining the difference between the feedback signal ef and the signal from the gain controller 22 in the subtracter 23.

Moreover, accumulation of charges of a signal input to the reverse input terminal of the operational amplifier 57 in the capacitor 55 corresponds to the function of the second integrator 24 shown in FIG. 2. Further, the resistance ratio between the resistors 52 and 53 functions as the gain controller 22 shown in FIG. 2.

The resistance ratio Gf1 between the resistors 50 and 51 is equal to the resistance ratio Gf2 between the resistors 52 and 53.

In addition, the comparator 58 corresponds to the comparator 25 shown in FIG. 2. Since the outputs of the operational amplifiers 56 and 57 are reversed to those of the first and second integrators 21 and 24 shown in FIG. 2, respectively, the output terminal of the operational amplifier 56 is connected to the "−" input terminal of the comparator 58 and the output terminal of the operational amplifier 57 is connected to the "+" input terminal of the comparator 58 to form a configuration with interconnection reversed to that of the comparator 25 shown in FIG. 2, so that the output of the comparator 58 is of the same phase as that of the comparator 25.

The forgoing is a specific exemplary configuration of the correction circuit 2 according to the first preferred embodiment.

In the above specific example, although the resistance ratio Gf1 between the resistors 50 and 51 and the resistance ratio Gf2 between the resistors 52 and 53 are equal to each other, even if these resistance ratios become somewhat different from each other, correction of distortion occurring in the power switch 3 can be performed normally only with fluctuations in duty cycle of the pulse modulated signal ei and feedback signal ef. However, by making the resistance ratios equal to each other, the waveform of the pulse modulated signal ei and that of the feedback signal ef can be made exactly equal to each other when no distortion occurs in the power switch 3, allowing correction to be easily performed without complicating the configuration.

Further, setting the resistance ratio Gf1 between the resistors 50 and 51 and the resistance ratio Gf2 between the resistors 52 and 53 at different values from each other and adjusting the resistance ratios Gf1, Gf2, constant G1 for gain of the first integrator 21, constant G2 for gain of the second integrator 24 and voltage Vpow supplied to the power switch 3 from the constant-voltage power supply corresponds to the function of the feedback circuit 5. Thus, the feedback circuit 5 may be omitted.

Second Preferred Embodiment

The correction circuit according to the present embodiment is to be incorporated in the class D amplifier shown in FIG. 1 described in the first preferred embodiment. The correction circuit is not for directly comparing a signal from the first integrator and that from the second integrator, but for obtaining the difference between the signal from the first integrator and that from the second integrator in a subtracter and then comparing an output signal (differential signal) from the subtracter and a signal obtained by integrating the differential signal in a third integrator and then reversed in a reverser, thereby generating a correction signal.

Figure 13:
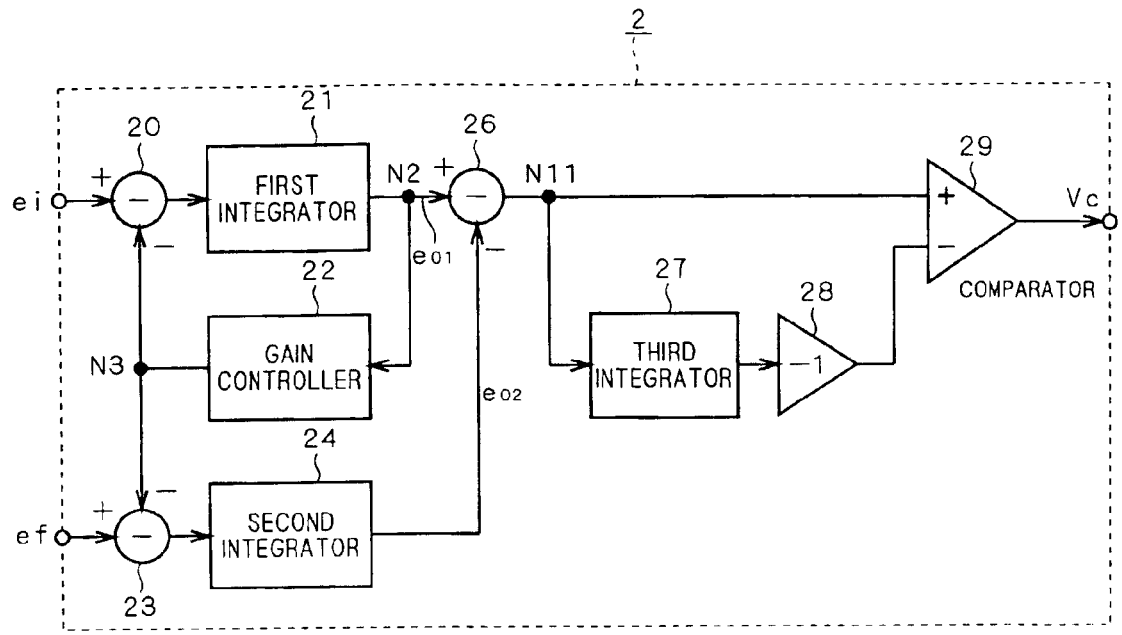
FIG. 13 is a block diagram illustrating the configuration of a correction circuit according to a second preferred embodiment of the invention.

A block diagram of the inner configuration of the correction circuit 2 according to the present embodiment is illustrated in FIG. 13. The configuration shown in FIG. 13 will be specifically described hereinbelow. In FIG. 13, the subtracter 20, first integrator 21, gain controller 22, subtracter 23 and second integrator 24 have the same configuration and carry out the same functions and operations as in FIG. 2 described in the first preferred embodiment, explanation of which is thus omitted here.

In FIG. 13, the first integrator 21 has its output terminal connected to the "+" input terminal of a subtracter 26 through the node N2, and the second integrator 24 has its output terminal connected to the "−" input terminal of the subtracter 26. Further, the subtracter 26 has its output branched off at a node N11 to be connected to the "+" input terminal of a comparator 29 as well as to be connected to the "−" input terminal of the comparator 29 through a third integrator 27 and a reverser 28.

The comparator 29 has its output terminal connected to the input terminal of the power switch 3 as in the first preferred embodiment.

In the present embodiment, as shown in FIG. 13, the integrated waveform output from the first integrator 21 and that from the second integrator 24 are not directly compared, but the difference between the integrated waveforms in the subtracter 26 and then an output signal (differential signal) from the subtracter 26 and a signal obtained by integrating the differential signal in the third integrator 27 and then reversed in the reverser 28, thereby generating a correction signal Vc in the comparator 29.

Here, the differential signal from the subtracter 26 contains the difference between a low frequency component of the pulse modulated signal ei and that of the feedback signal ef. The difference between the low frequency components represents an error contained in the feedback signal ef, i.e., distortion in an output audio signal, and the distortion is corrected in the comparator 29.

It is apparent that the correction operation is the same as in the first preferred embodiment if a fixed reference potential (Vsig/2) is connected to the "−" input terminal of the comparator 29, for example.

In the present embodiment, however, such fixed reference potential (Vsig/2) is not connected to the "−" input terminal of the comparator 29, but the third integrator 27 for integrating the differential signal from the subtracter 26 which operates with reference to Vsig/2 and the reverser 28 for reversing the differential signal are connected to the "−" input terminal of the comparator 29. This further presents the following effect in addition to the above-described effect of correction.

That is, the difference between the low frequency components of the pulse modulated signal ei and feedback signal ef (i.e., distortion in an output audio signal) contained in the differential signal output from the subtracter 26 is further integrated and thus accentuated in the third integrator 27, and is thereafter reversed in the reverser 28, so that accentuated distortion in the output audio signal in the comparator 29 are added to the differential signal output from the subtracter 26. Thus, the correction signal Vc corresponding to the distortion in the output audio signal can be generated in the comparator 29 with the distortion being accentuated more than in the first preferred embodiment. This achieves effects of correction higher than in the correction circuit described in the first preferred embodiment.

Next, the state of waveforms at respective points in the correction circuit 2 will be described.

Figure 14:
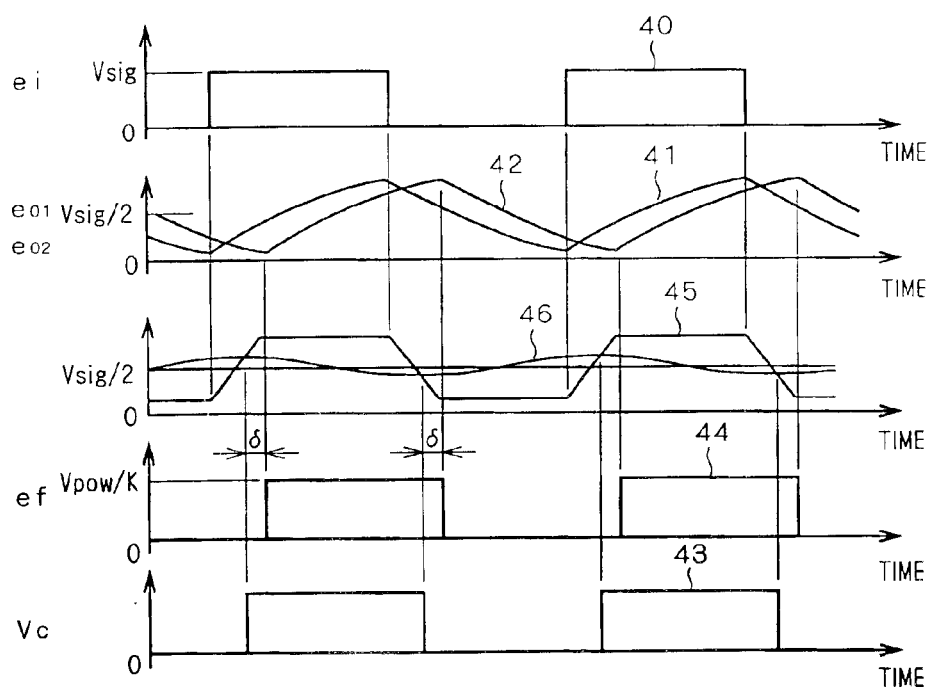
FIG. 14 illustrates signal waveforms in the steady state at respective points in the correction circuit according to the second preferred embodiment when no distortion occurs.

First, a case in which no distortion occurs in the power switch 3 will be described. FIG. 14 illustrates waveforms in the steady state at respective points in the correction circuit 2 in this case. The horizontal axis represents time and the vertical axis represents voltage value.

In FIG. 14, reference numeral 40 represents a pulse waveform of the pulse modulated signal ei output from the pulse modulator 1 and input to the correction circuit 2, and 41 represents an integrated waveform of the integrated signal eo1 generated in the first integrator 21 based on the pulse waveform 40.

Reference numeral 44 represents a pulse waveform of the feedback signal ef from the feedback circuit 5 input to the correction circuit 2, and 42 represents an integrated waveform of the integrated signal eo2 generated in the second integrator 24 based on the pulse waveform 44.

Reference numeral 45 represents a waveform of a signal generated in the subtracter 26 by subtracting the integrated waveform 42 from the integrated waveform 41, and 46 represents an integrated waveform obtained by integrating the waveform 45 in the third integrator 27 and reversing the waveform 45 in the reverser 28.

Reference numeral 43 represents a pulse waveform of the correction signal Vc generated in the comparator 29 as a binary pulse of "H" or "L" (i.e., "0" or "1") in accordance with the difference between the waveforms 45 and 46. Specifically, when the waveform 45 is higher than the waveform 46, a pulse of "H" (or "1") is generated, while a pulse of "L" (or "0") is generated when the waveform 45 is lower than the waveform 46.

The pulse waveform 40 shall have an amplitude ranging between approximately zero and Vsig. Provided that voltage supplied to the power switch 3 from the constant-voltage power supply is Vpow and a fixed attenuation gain in the feedback circuit 5 is 1/K, the pulse waveform 44 output from the feedback circuit 5 has an amplitude ranging between approximately zero and Vpow/K, and the feedback circuit 5 is set such that the amplitude of the pulse waveform 44 is equal to the amplitude of the pulse waveform 40 output from the pulse modulator 1 (i.e., Vpow/K=Vsig).

In the case where the pulse waveforms 40 and 44 are in the state shown in FIG. 14 and the first integrator 21 and second integrator 24 operate on the basis of approximately Vsig/2 by the action of the gain controller 22 and the like, the integrated waveforms 41 and 42 are formed as shown in FIG. 14. Provided that the subtracter 26 and third integrator 27 operate on the basis of approximately Vsig/2, the waveforms 45 and 46 are formed as shown in FIG. 14.

Therefore, the correction signal Vc output from the comparator 29 has the pulse waveform 43. Here, in the steady state, the pulse waveform 44 has the delay time δ caused mainly by the power switch 3 with respect to the pulse waveform 43 output from the comparator 29.

That is, FIG. 14 shows that the pulse waveform 44 which is the feedback signal ef comes to have a similar waveform to the pulse waveform 40 which is the pulse modulated signal ei in the case where the correction circuit 2 operates normally in the steady state which causes no distortion in the power switch 3. This means the low frequency components of both the pulse waveforms 40 and 44 are equal to each other and an audio signal is transmitted normally without distortion.

The feedback signal ef actually contains waveform distortion resulting mainly from the power switch 3. The distortion deforms the waveform of the feedback signal ef, causing the low frequency component of the feedback signal ef to have a difference from the low frequency component of the pulse modulated signal ei.

The following description explains that there are four patterns of waveform distortion illustrated in FIGS. 4A to 7B which are caused by the power switch 3, and that the correction circuit of the class D amplifier according to the present embodiment performs a normal correction operation when these four patterns of distortion occur. These four patterns or combination of these patterns can represent any distortion which actually occurs.

Description will now be made on how the waveforms at respective points in the correction circuit 2 change in the steady state in the case where these four patterns of distortion occur.

First, the first pattern of distortion will be described. FIG. 15 illustrates waveforms at respective points in the correction circuit 2 which is brought into the steady state by correction in the case of the first type of distortion. The horizontal axis represents time and the vertical axis represents voltage value.

In FIG. 15, the pulse waveform 40 and integrated waveform 41 are the same as those shown in FIG. 14, repeated explanation of which is thus omitted here.

Reference numeral 44a represents a pulse waveform of the feedback signal ef output from the feedback circuit 5 and input to the correction circuit 2 which is brought into the steady state by correction performed by the class D amplifier of the present embodiment at the occurrence of the first type of distortion in the power switch 3, and 42a represents an integrated waveform of the integrated signal eo2 generated in the second integrator 24 based on the pulse waveform 44a.

Reference numeral 45a represents a waveform of a signal generated in the subtracter 26 by subtracting the integrated waveform 42a from the integrated waveform 41, and 46a represents an integrated waveform formed by integrating the waveform 45a in the third integrator 27 and reversing the waveform 45a in the reverser 28.

Reference numeral 43a represents a pulse waveform of the correction signal Vc generated in the comparator 29 as a binary pulse of "H" or "L" (i.e., "0" or "1") in accordance with the difference between the integrated waveforms 45a and 46a. Specifically, when the waveform 45a is higher than the waveform 46a, a pulse of "H" (or "1") is generated, while a pulse of "L" (or "0") is generated when the waveform 45a is lower than the waveform 46a.

The pulse waveform 40 shall have an amplitude ranging between approximately zero and Vsig. No distortion occurs in the amplitude in the first type of distortion. Therefore, provided that voltage supplied to the power switch 3 from the constant-voltage power supply is Vpow and a fixed attenuation gain in the feedback circuit 5 is 1/K, the pulse waveform 44a output from the feedback circuit 5 has an amplitude ranging between approximately zero and Vpow/K and becomes equal to the amplitude of the pulse waveform 40 output from the pulse modulator 1 by the action of the feedback circuit 5 (i.e., Vpow/K=Vsig).

When correction in the correction circuit 2 is performed normally, the pulse area of the pulse waveform 44a corresponding to one cycle of the frequency in the steady state becomes equal to the pulse area of the pulse waveform 40 corresponding to one cycle of the frequency.

In the case where the pulse waveforms 40 and 44a are as shown in FIG. 15 and where the first and second integrators 21 and 24 operate on the basis of approximately Vsig/2 by the action of the gain controller 22 and the like, the integrated waveforms 41 and 42a are formed as shown in FIG. 15.

In the first type of distortion in the power switch 3 (FIGS. 4A, 4B), the average value of the integrated waveform 42a is greater than that of the integrated waveform 42 generated in the case where no distortion occurs as shown in FIG. 14.

This shortens time periods during which the integrated waveform 45a generated in the subtracter 26 based on the difference between the integrated waveforms 41 and 42a exceeds the reference level Vsig/2. On the other hand, the integrated waveform 46a formed by the third integrator 27 and reverser 28 based on the waveform 45a exceeds the reference level Vsig/2 in average.

Therefore, the correction signal Vc output from the comparator 29 based on the difference between the waveforms 45a and 46a has the pulse waveform 43a. In the present embodiment, the correction signal Vc is capable of correcting accentuated distortion in an output audio signal.

As shown in FIG. 15, by the normal action of the comparator 29, the pulse width of the pulse waveform 43a is formed to be smaller than the pulse width of the pulse waveform 44a by te1 in response to the first type of distortion (that is, time periods during which the pulse waveform 43a is in the "H" level are shortened as compared to the case where no distortion occurs as shown in FIG. 14).

Consequently, even when the pulse waveform 43a of pulse width as shown in FIG. 15 is fed back and input again to the power switch 3, causing the first type of distortion to occur in the power switch 3, which causes the pulse width to be increased by te1, the pulse width of the pulse waveform 44a becomes equal to that of the waveform 40. FIG. 15 also shows that the delay time 6 resulting mainly from the power switch 3 arises between the pulse waveforms 43a and 44a.

As described, in the case where the first type of distortion occurs in the power switch 3, the class D amplifier of the present embodiment sets the pulse width of the pulse waveform 43a output from the comparator 29 to be smaller than the pulse width of the pulse waveform 40 by te1 in response to the first type of distortion, thereby correcting the first type of distortion in the power switch 3 to make the pulse width of the pulse waveform 44a almost equal to that of the pulse waveform 40 in the steady state, i.e., to make the pulse area of the pulse waveform 44a corresponding to one cycle of the frequency almost equal to the pulse area of the pulse waveform 40 corresponding to one cycle of the frequency. This is to make the low frequency component of the feedback signal ef and that of the pulse modulated signal ei almost equal to each other, which means these signals have no error therebetween, i.e., distortion in an audio signal is corrected.

Next, the second type of distortion will be described. FIG. 16 illustrates the waveforms at respective points in the correction circuit 2 which is brought into the steady state by performing correction at the occurrence of the second type of distortion. The horizontal axis represents time and the vertical axis represents voltage value.

In FIG. 16, the pulse waveform 40 and integrated waveform 41 are the same as those shown in FIG. 15, repeated explanation of which is thus omitted here.

Reference numeral 44b represents a pulse waveform of the feedback signal ef output from the feedback circuit 5 and input to the correction circuit 2 which is brought into the steady state by correction performed by the class D amplifier of the present embodiment at the occurrence of the second type of distortion in the power switch 3, and 42b represents an integrated waveform of the integrated signal eo2 generated in the second integrator 24 based on the pulse waveform 44b.

Reference numeral 45b represents a waveform of a signal generated in the subtracter 26 by subtracting the integrated waveform 42b from the integrated waveform 41, and 46b represents an integrated waveform formed by integrating the waveform 45b in the third integrator 27 and reversing the waveform 45b in the reverser 28.

Reference numeral 43b represents a pulse waveform of the correction signal Vc generated in the comparator 29 as a binary pulse of "H" or "L" (i.e., "0" or "1") in accordance with the difference between the integrated waveforms 45b and 46b. Specifically, when the waveform 45b is higher than the waveform 46b, a pulse of "H" (or "1") is generated, while a pulse of "L" (or "0") is generated when the waveform 45b is lower than the waveform 46b.

The pulse waveform 40 shall have an amplitude ranging between approximately zero and Vsig. No distortion occurs in the amplitude in the second type of distortion. Therefore, provided that voltage supplied to the power switch 3 from the constant-voltage power supply is Vpow and a fixed attenuation gain in the feedback circuit 5 is 1/K, the pulse waveform 44b output from the feedback circuit 5 has an amplitude ranging between approximately zero and Vpow/K and becomes equal to the amplitude of the pulse waveform 40 output from the pulse modulator 1 by the action of the feedback circuit 5 (i.e., Vpow/K=Vsig).

When correction in the correction circuit 2 is performed normally, the pulse area of the pulse waveform 44b corresponding to one cycle of the frequency in the steady state becomes equal to the pulse area of the pulse waveform 40 corresponding to one cycle of the frequency.

In the case where the pulse waveforms 40 and 44b are as shown in FIG. 16 and where the first and second integrators 21 and 24 operate on the basis of approximately Vsig/2 by the action of the gain controller 22 and the like, the integrated waveforms 41 and 42b are formed as shown in FIG. 16.

In the second type of distortion in the power switch 3 (FIGS. 5A, 5B), the average value of the integrated waveform 42b is smaller than that of the integrated waveform 42 generated in the case where no distortion occurs as shown in FIG. 14.

Thus, time periods during which the integrated waveform 45b generated in the subtracter 26 based on the difference between the integrated waveforms 41 and 42b exceeds the reference level Vsig/2 are extended. On the other hand, the integrated waveform 46b formed by the third integrator 27 and reverser 28 based on the waveform 45b is below the reference level Vsig/2 in average.

Therefore, the correction signal Vc output from the comparator 29 based on the difference between the waveforms 45b and 46b has the pulse waveform 43b. In the present embodiment, the correction signal Vc is capable of correcting accentuated distortion in an output audio signal.

As shown in FIG. 16, by the normal action of the comparator 29, the pulse width of the pulse waveform 43b is formed to be greater than the pulse width of the pulse waveform 44b by te2 in response to the second type of distortion (that is, time periods during which the pulse waveform 43b is in the "H" level are extended as compared to the case where no distortion occurs as shown in FIG. 14).

Consequently, even when the pulse waveform 43b of pulse width as shown in FIG. 16 is fed back and input again to the power switch 3, causing the second type of distortion to occur in the power switch 3, which causes the pulse width to be reduced by te2, the pulse width of the pulse waveform 44b becomes equal to that of the waveform 40. FIG. 16 also shows that the delay time δ resulting mainly from the power switch 3 arises between the pulse waveforms 43b and 44b.

As described, in the case where the second type of distortion occurs in the power switch 3, the class D amplifier of the present embodiment sets the pulse width of the pulse waveform 43b output from the comparator 29 to be greater than the pulse width of the pulse waveform 40 by te2 in response to the second type of distortion, thereby correcting the second type of distortion in the power switch 3 to make the pulse width of the pulse waveform 44b almost equal to that of the pulse waveform 40 in the steady state, i.e., to make the pulse area of the pulse waveform 44b corresponding to one cycle of the frequency almost equal to the pulse area of the pulse waveform 40 corresponding to one cycle of the frequency. This is to make the low frequency component of the feedback signal ef and that of the pulse modulated signal ei almost equal to each other, which means these signals have no error therebetween, i.e., distortion in an audio signal is corrected.

Figure 17:
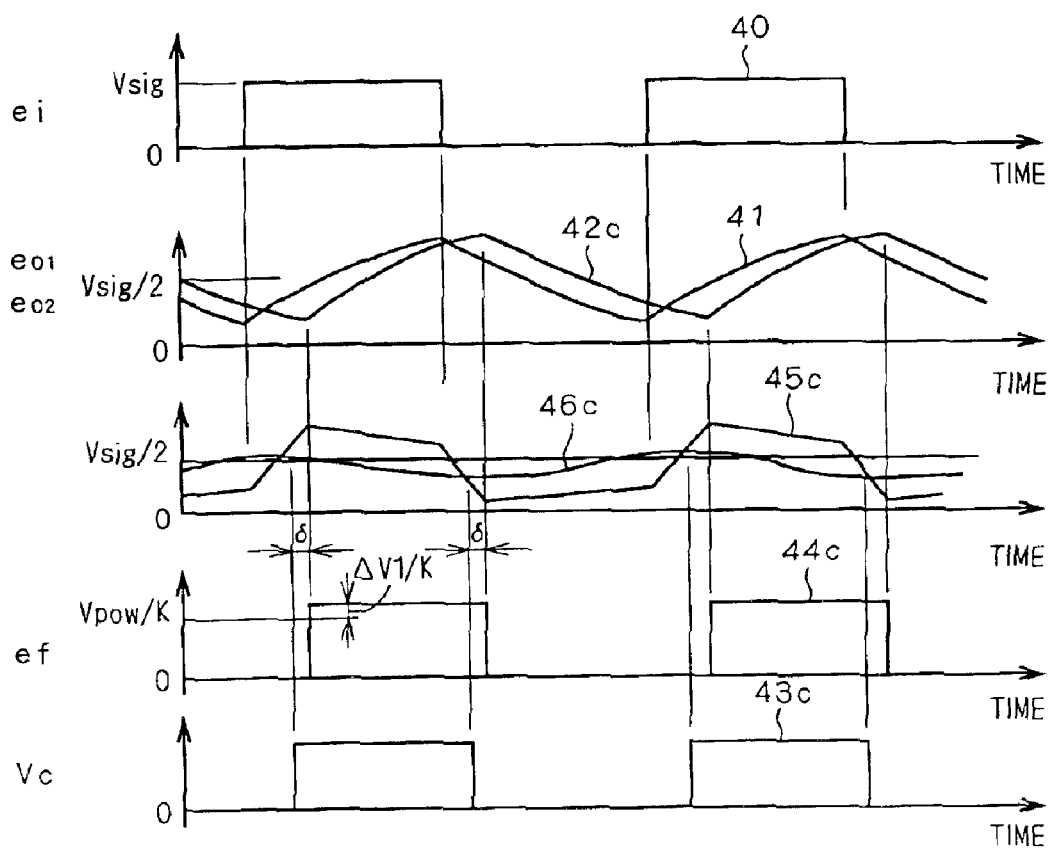
FIG. 17 illustrates signal waveforms in the steady state at respective points in the correction circuit according to the second preferred embodiment when the third type of distortion occurs.

Next, the third type of distortion will be described. FIG. 17 illustrates the waveforms at respective points in the correction circuit 2 which is brought into the steady state by correction at the occurrence of the third type of distortion. The horizontal axis represents time and the vertical axis represents voltage value.

In FIG. 17, the pulse waveform 40 and integrated waveform 41 are the same as those shown in FIG. 15, repeated explanation of which is thus omitted here.

Reference numeral 44c represents a pulse waveform of the feedback signal ef output from the feedback circuit 5 and input to the correction circuit 2 which is brought into the steady state by correction performed by the class D amplifier of the present embodiment at the occurrence of the third type of distortion in the power switch 3, and 42c represents an integrated waveform of the integrated signal eo2 generated in the second integrator 24 based on the pulse waveform 44c.

Reference numeral 45c represents a waveform of a signal generated in the subtracter 26 by subtracting the integrated waveform 42c from the integrated waveform 41, and 46c represents an integrated waveform formed by integrating the waveform 45c in the third integrator 27 and reversing the waveform 45c in the reverser 28.

Reference numeral 43c represents a pulse waveform of the correction signal Vc generated in the comparator 29 as a binary pulse of "H" or "L" (i.e., "0" or "1") in accordance with the difference between the integrated waveforms 45c and 46c. Specifically, when the waveform 45c is higher than the waveform 46c, a pulse of "H" (or "1") is generated, while a pulse of "L" (or "0") is generated when the waveform 45c is lower than the waveform 46c.

The pulse waveform 40 shall have an amplitude ranging between approximately zero and Vsig. In the third type of distortion, distortion occurs in the amplitude of +ΔV1 with respect to the reference voltage value Vpow supplied to the power switch 3 from the constant-voltage power supply. Therefore, provided that a fixed attenuation gain in the feedback circuit 5 is 1/K, the amplitude of the pulse waveform 44c output from the feedback circuit 5 ranges between approximately zero and (Vpow+ΔV1)/K, and is thus not equal to but greater than the amplitude of the pulse waveform 40 output from the pulse modulator 1 by ΔV1/K.

When correction in the correction circuit 2 is performed normally, the pulse area of the pulse waveform 44c corresponding to one cycle of the frequency in the steady state becomes equal to the pulse area of the pulse waveform 40 corresponding to one cycle of the frequency.

In the case where the pulse waveforms 40 and 44c are as shown in FIG. 17 and where the first and second integrators 21 and 24 operate on the basis of approximately Vsig/2 by the action of the gain controller 22 and the like, the integrated waveforms 41 and 42c are formed as shown in FIG. 17.

In the third type of distortion in the power switch 3 (FIGS. 6A, 6B), the average value of the integrated waveform 42c is greater than that of the integrated waveform 42 generated in the case where no distortion occurs as shown in FIG. 14.

Thus, time periods during which the integrated waveform 45c generated in the subtracter 26 based on the difference between the integrated waveforms 41 and 42c exceeds the reference level Vsig/2 are shortened. On the other hand, the integrated waveform 46c formed by the third integrator 27 and reverser 28 based on the waveform 45c exceeds the reference level Vsig/2 in average.

Therefore, the correction signal Vc output from the comparator 29 on the basis of the difference between the waveforms 45c and 46c has the pulse waveform 43c. In the present embodiment, the correction signal Vc is capable of correcting accentuated distortion in an output audio signal.

As shown in FIG. 17, by the normal action of the comparator 29, the pulse width of the pulse waveform 43c is formed to be smaller than the pulse width of the pulse waveform 40 in response to the third type of distortion (i.e., increase in the amplitude by ΔV1) (that is, time periods during which the pulse waveform 43c is in the "H" level are shortened as compared to the case where no distortion occurs as shown in FIG. 14).

Consequently, even when the pulse waveform 43c of pulse width as shown in FIG. 17 is fed back and input again to the power switch 3, causing the third type of distortion to occur in the power switch 3, which causes the amplitude to be increased as compared to a normal value by ΔV1 with the pulse width remains unchanged, the pulse area of the pulse waveform 44c corresponding to one cycle of the frequency becomes almost equal to the pulse area of the pulse waveform 40 corresponding to one cycle of the frequency. FIG. 17 also shows that the delay time δ resulting mainly from the power switch 3 arises between the pulse waveforms 43c and 44c.

As described, in the case where the third type of distortion occurs in the power switch 3, the class D amplifier of the present embodiment sets the pulse width of the pulse waveform 43c output from the comparator 29 to be smaller than the pulse width of the pulse waveform 40 in response to the third type of distortion (i.e., increase in the amplitude by ΔV1), thereby correcting the third type of distortion in the power switch 3 to make the pulse area of the pulse waveform 44c corresponding to one cycle of the frequency almost equal to the pulse area of the pulse waveform 40 corresponding to one cycle of the frequency. This is to make the low frequency component of the feedback signal ef and that of the pulse modulated signal ei almost equal to each other, which means these signals have no error therebetween, i.e., distortion in an audio signal is corrected.

In this case, increase in the amplitude of the integrated waveform 42c causing the upper side of the waveform 45c to have a negative inclination is effective at reducing the pulse width of the correction signal Vc output from the comparator 29.

Figure 18:
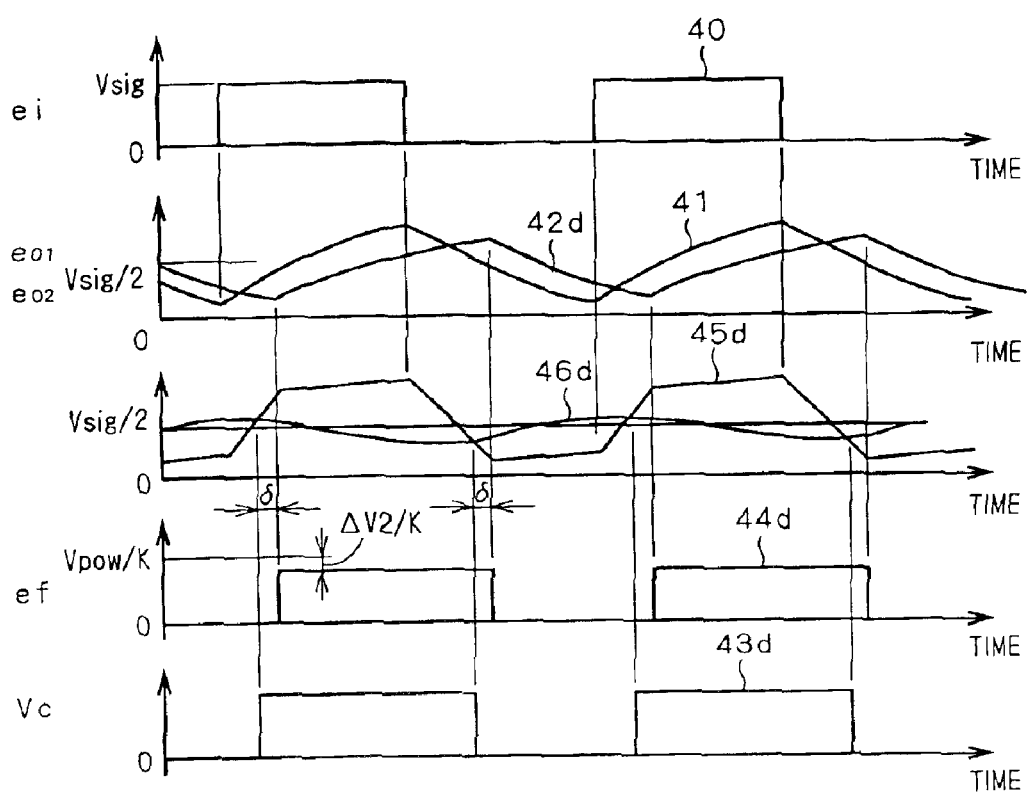
FIG. 18 illustrates signal waveforms in the steady state at respective points in the correction circuit according to the second preferred embodiment when the fourth type of distortion occurs.

Next, the fourth type of distortion will be described. FIG. 18 illustrates the waveforms at respective points in the correction circuit 2 which is brought into the steady state by correction at the occurrence of the fourth type of distortion. The horizontal axis represents time and the vertical axis represents voltage value.

In FIG. 18, the pulse waveform 40 and integrated waveform 41 are the same as those shown in FIG. 15, repeated explanation of which is thus omitted here.

Reference numeral 44d represents a pulse waveform of the feedback signal ef output from the feedback circuit 5 and input to the correction circuit 2 which is brought into the steady state by correction performed by the class D amplifier of the present embodiment at the occurrence of the fourth type of distortion in the power switch 3, and 42d represents an integrated waveform of the integrated signal eo2 generated in the second integrator 24 based on the pulse waveform 44d.

The reference numeral 45d represents a waveform of a signal generated in the subtracter 26 by subtracting the integrated waveform 42d from the integrated waveform 41, and 46d represents an integrated waveform formed by integrating the waveform 45d in the third integrator 27 and reversing the waveform 45d in the reverser 28.

Reference numeral 43d represents a pulse waveform of the correction signal Vc generated in the comparator 29 as a binary pulse of "H" or "L" (i.e., "0" or "1") in accordance with the difference between the waveforms 45d and 46d. Specifically, when the waveform 45d is higher than the waveform 46d, a pulse of "H" (or "1") is generated, while a pulse of "L" (or "0") is generated when the waveform 45d is lower than the waveform 46d.

The pulse waveform 40 shall have an amplitude ranging between approximately zero and Vsig. In the fourth type of distortion, distortion occurs in the amplitude of −ΔV2 with respect to the reference voltage value Vpow supplied to the power switch 3 from the constant-voltage power supply. Therefore, provided that a fixed attenuation gain in the feedback circuit 5 is 1/K, the pulse waveform 44d output from the feedback circuit 5 has an amplitude ranging between approximately zero and (Vpow−ΔV2)/K. Thus, the amplitude of the pulse waveform 44d is not equal to but smaller than the amplitude of the pulse waveform 40 output from the pulse modulator 1 by ΔV2/K.

When correction in the correction circuit 2 is performed normally, the pulse area of the pulse waveform 44d corresponding to one cycle of the frequency in the steady state becomes equal to the pulse area of the pulse waveform 40 corresponding to one cycle of the frequency.

In the case where the pulse waveforms 40 and 44d are as shown in FIG. 18 and where the first and second integrators 21 and 24 operate on the basis of approximately Vsig/2 by the action of the gain controller 22 and the like, the integrated waveforms 41 and 42d are formed as shown in FIG. 18.

In the fourth type of distortion in the power switch 3 (FIGS. 7A, 7B), the average value of the integrated waveform 42d is smaller than that of the integrated waveform 42 generated in the case where no distortion occurs as shown in FIG. 14.

Thus, time periods during which the integrated waveform 45d generated in the subtracter 26 based on the difference between the integrated waveforms 41 and 42d exceeds the reference level Vsig/2 are extended. On the other hand, the integrated waveform 46d formed by the third integrator 27 and reverser 28 based on the waveform 45d is below the reference level Vsig/2 in average.

Therefore, the correction signal Vc output from the comparator 29 on the basis of the difference between the waveforms 45d and 46d has the pulse waveform 43d. In the present embodiment, the correction signal Vc is capable of correcting accentuated distortion in an output audio signal.

As shown in FIG. 18, by the normal action of the comparator 29, the pulse width of the pulse waveform 43d is formed to be greater than the pulse width of the pulse waveform 40 in response to the fourth type of distortion (i.e., reduction in the amplitude by ΔV2) (that is, time periods during which the pulse waveform 43d is in the "H" level are extended as compared to the case where no distortion occurs as shown in FIG. 14).

Consequently, even when the pulse waveform 43d of pulse width as shown in FIG. 18 is fed back and input again to the power switch 3, causing the fourth type of distortion to occur in the power switch 3, which causes the amplitude to be reduced as compared to a normal value by ΔV2 with the pulse width remains unchanged, the pulse area of the pulse waveform 44d corresponding to one cycle of the frequency becomes almost equal to the pulse area of the pulse waveform 40 corresponding to one cycle of the frequency. FIG. 18 also shows that the delay time δ resulting mainly from the power switch 3 arises between the pulse waveforms 43d and 44d.

As described, in the case where the fourth type of distortion occurs in the power switch 3, the class D amplifier of the present embodiment sets the pulse width of the pulse waveform 43d output from the comparator 29 to be greater than the pulse width of the pulse waveform 40 in response to the fourth type of distortion (i.e., reduction in the amplitude by ΔV2), thereby correcting the fourth type of distortion in the power switch 3 to make the pulse area of the pulse waveform 44d corresponding to one cycle of the frequency almost equal to the pulse area of the pulse waveform 40 corresponding to one cycle of the frequency. This is to make the low frequency component of the feedback signal ef and that of the pulse modulated signal ei almost equal to each other, which means these signals have no error therebetween, i.e., distortion in an audio signal is corrected.

In this case, reduction in the amplitude of the integrated waveform 42d causing the upper side of the waveform 45d to have a positive inclination is effective at increasing the pulse width of the correction signal Vc output from the comparator 29.

The forgoing description has been directed to the process in which the correction circuit 2 according to the present embodiment transmits the pulse modulated signal ei to its output while performing correction based on feedback.

As described, the class D amplifier having the configuration shown in FIGS. 1 and 13 can reduce (or correct) distortion in an audio signal resulting mainly from the operation of the power switch 3.

Further, in the class D amplifier according to the present embodiment, the integrated waveforms from the first and second integrators 21 and 24 are not directly input to a comparator, but are subjected to subtraction in the subtracter 26, and a resulting subtraction signal is output. Thereafter, the subtraction signal and the signal obtained by integrating the subtraction signal in the third integrator 27 and reversing the signal in the reverser 28 are input to the comparator 29 for comparison, so as to accentuate distortion in an audio signal. This can further improve effects of correction at reducing (or correcting) distortion in an audio signal as compared to the first preferred embodiment.

Specific Example of the Second Preferred Embodiment

A more specific exemplary configuration of the correction circuit 2 according to the present embodiment shown in FIG. 19 will be described below.

The configuration of the stage previous to the outputs of the operational amplifiers 56 and 57 is the same as that shown in FIG. 12 and constitutes the subtracters 20 and 23, first integrator 21, second integrator 24 and gain controller 22 shown in the block diagram of FIG. 13. Specific connection relationship and functions of respective circuits have been described in the specific example of the first preferred embodiment, repeated explanation of which is thus omitted here.

Figure 19:
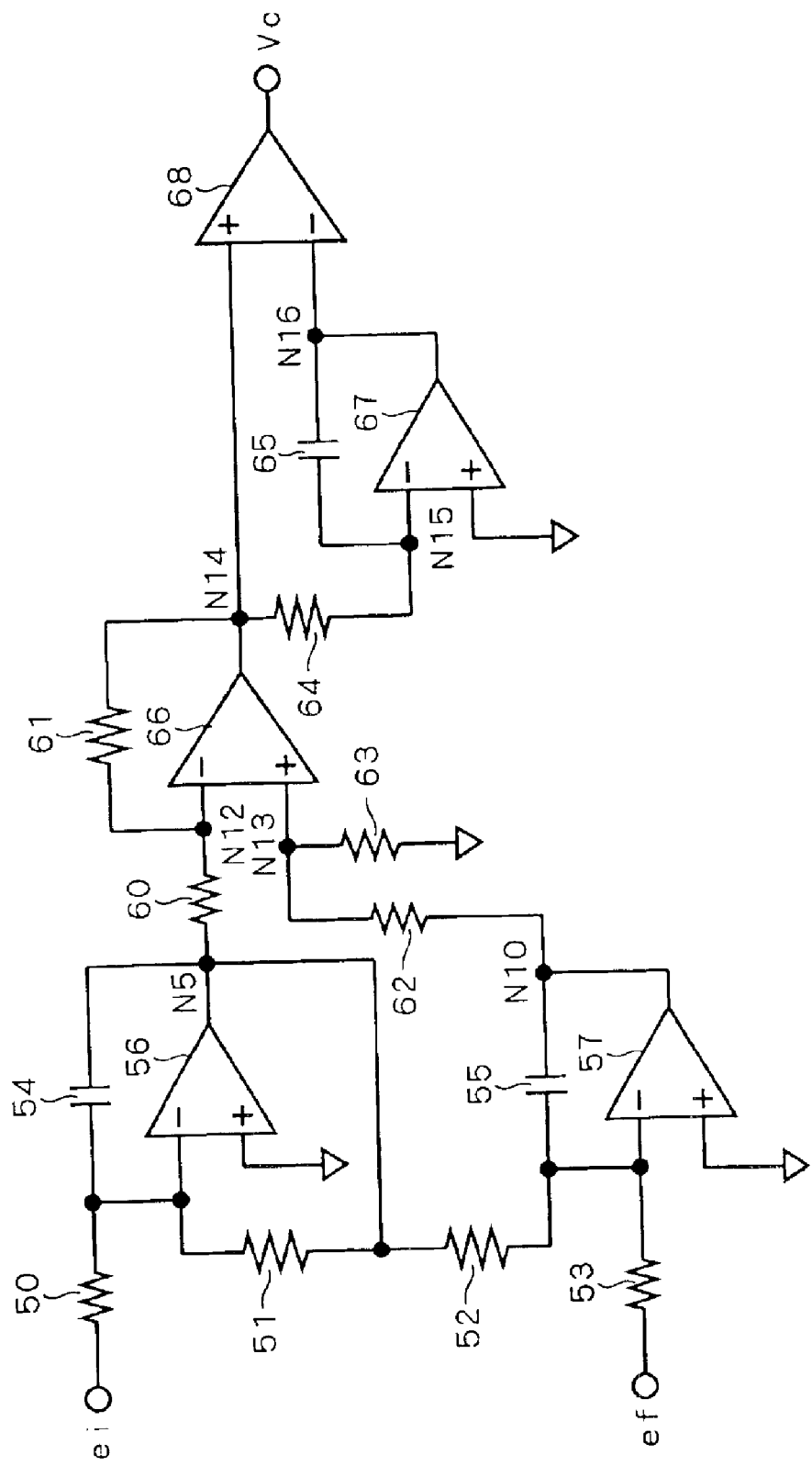
FIG. 19 illustrates a specific circuit configuration of the correction circuit according to the second preferred embodiment.

Now referring to the correction circuit 2 of the present specific example shown in FIG. 19, the operational amplifier 56 has its output connected to the reverse ("−") input terminal of an operational amplifier 66 through the node N5, a resistor 60 and a node N12, while the operational amplifier 57 has its output connected to the non-reverse ("+") input terminal of the operational amplifier 66 through the node N10, a resistor 62 and a node N13.

The operational amplifier 66 provides negative feedback through a resistor 61 and has its non-reverse input terminal connected to an appropriate fixed potential through the node N13 and a resistor 63.

The operational amplifier 66 has its output branched at a node N14 to be connected to the non-reverse ("+") input terminal of a comparator 68 as well as to be connected to the reverse ("−") input terminal of an operational amplifier 67 through a resistor 64 and a node N15. The operational amplifier 67 has its non-reverse ("+") input terminal connected to an appropriate fixed potential.

The operational amplifier 67 provides negative feedback through a node N16, a capacitor 65 and the node N15.

The operational amplifier 67 has its output terminal connected to the reverse ("−") input terminal of the comparator 68 through the node N16. The comparator 68 has its output terminal connected to the input terminal of the power switch 3 shown in FIG. 1.

In the correction circuit 2 configured as above described, the resistors 60 to 63 and operational amplifier 66 constitute the subtracter 26 shown in FIG. 13.

However, output signals from the operational amplifiers 56 and 57 are reversed to those of the first and second integrators 21 and 24 shown in FIG. 13, respectively. Thus, the output terminal of the operational amplifier 56 is connected to the reverse input terminal of the operational amplifier 66 and the output terminal of the operational amplifier 57 is connected to the non-reverse input terminal of the operational amplifier 66, thereby bringing output signals from the operational amplifier 66 and subtracter 26 shown in FIG. 13 into the same phase.

The resistor 64, capacitor 65 and operational amplifier 67 constitute the third integrator 27 and reverser 28 shown in FIG. 13 and has the function of integrating and reversing a signal output from the operational amplifier 66.

As described, the exemplary circuit shown in FIG. 19 constitutes the correction circuit 2 according to the present embodiment.

Measured Data

Figure 20:
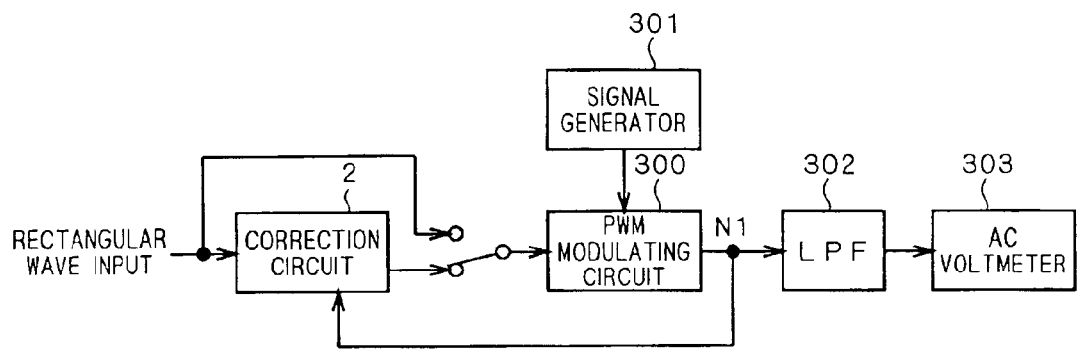
FIG. 20 illustrates the configuration of a measuring circuit for evaluating the effects of correction achieved by the correction circuit according to the invention.

FIG. 20 is a block diagram illustrating a measuring circuit for measuring actual effects of correction in the case of using the correction circuit shown in FIG. 12 (Specific example of the first preferred embodiment) or FIG. 19 (Specific example of the second preferred embodiment).

Measurement using the measuring circuit shown in FIG. 20 was performed by inputting a square wave having a duty ratio of 50% to the correction circuit 2 and inputting an output of the correction circuit 2 to the feedback input terminal of the correction circuit 2 after being provided with disturbance from a signal generator 301 in a PWM modulating circuit 300.

Evaluations were made by comparing the result of observation in an AC voltmeter 303 of a decoded output level of a pulse wave input signal obtained by inputting a rectangular wave directly to the PWM modulating circuit 300 without passing through the correction circuit 2 which passes through the LPF 302, and the result of observation in the AC voltmeter 303 of a decoded output level of a pulse wave input signal in the state which disturbance provided by the signal generator 301 in the PWM modulating circuit 300 is suppressed by the correction circuit 2.

Figure 21:
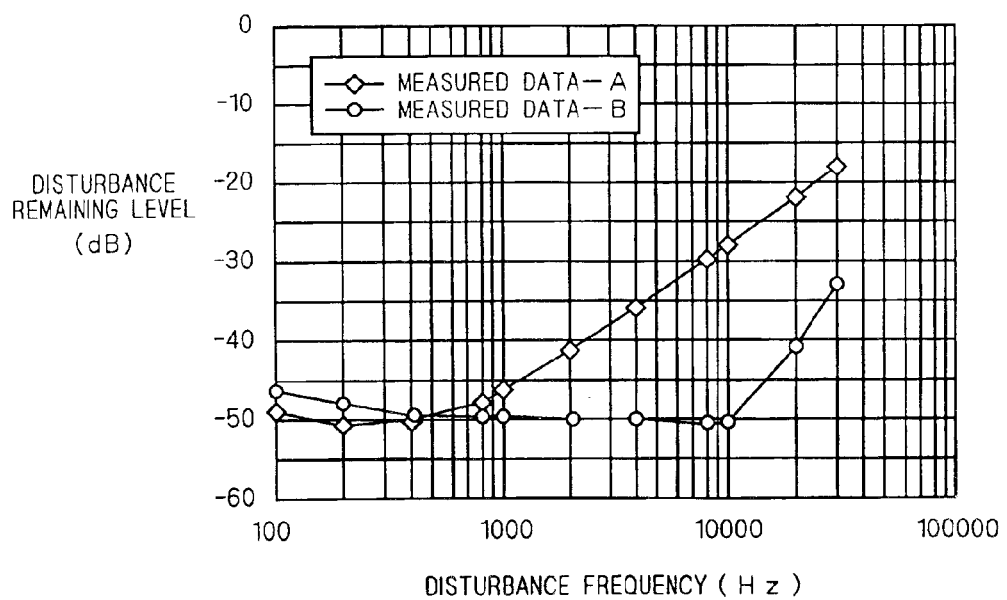
FIG. 21 is a graph plotting measured data indicating the effects of correction achieved by the correction circuit according to the invention.

The results of evaluations are plotted in the graph of FIG. 21. In the graph of FIG. 21, the vertical axis represents disturbance remaining level, and the horizontal axis represents disturbance frequency. Here, measured data A was obtained using the correction circuit shown in FIG. 12 as the correction circuit 2, and measured data B was obtained using the correction circuit shown in FIG. 19 as the correction circuit 2.

As is apparent from the graph of FIG. 21, the correction circuit 2 described in the first preferred embodiment carries out good effects of correction, and the correction circuit 2 described in the second preferred embodiment carries out better effects of correction.

Although the output stage has been described as single-ended in the above description, the present invention may also be applied to so-called BTL (balanced transformer-less) configuration having two output stages for outputting audio signals 180° out of phase with each other. That is, additionally applying the correction circuit according to the present invention to each output stage in the BTL configuration, the effects of correction of distortion can be obtained.

Third Preferred Embodiment

Figure 22:
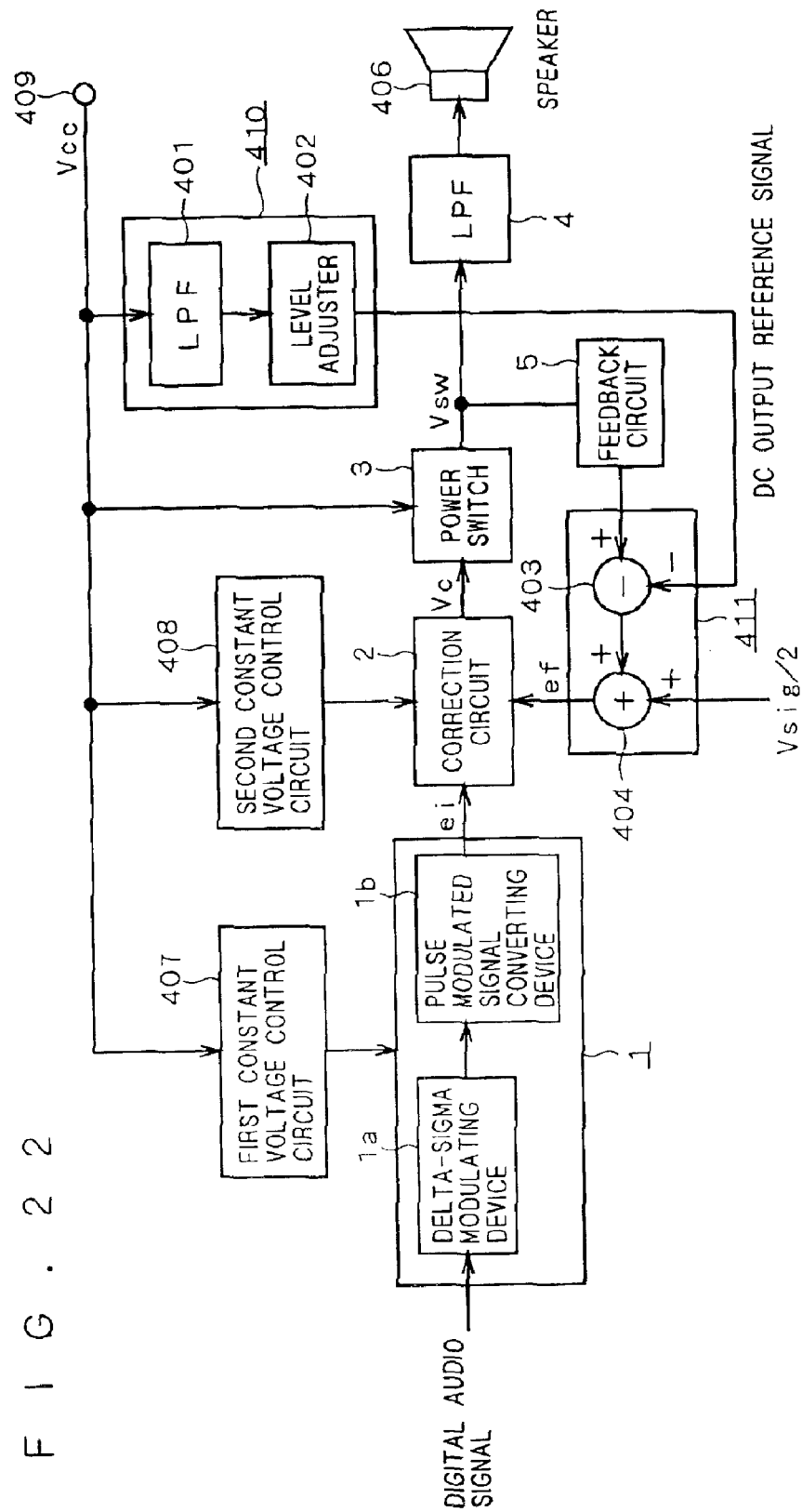
FIG. 22 is a block diagram illustrating the configuration of a class D amplifier according to a third preferred embodiment of the invention.

FIG. 22 is a block diagram of the configuration of a class D amplifier according to a third preferred embodiment of the present invention. The class D amplifier comprises the pulse modulator 1, correction circuit 2, power switch 3, LPF 4, feedback circuit 5, a speaker 406, a first constant voltage control circuit 407, a second constant voltage control circuit 408, dc output reference signal generator 410 and an arithmetic unit 411. The class D amplifier is supplied with a supply voltage Vcc from an external source through a power terminal 409.

The pulse modulator 1 generates a pulse modulated signal, and the power switch 3 performs switching between the power supply and ground in accordance with a correction signal corrected in the correction circuit 2, enabling power supply to a load (speaker 406) connected to the output of the class D amplifier. The switching operation is carried out by switching devices configured as described in the first preferred embodiment.

The LPF 4 removes a high frequency component from an output signal from the power switch 3 to demodulate an audio signal to be supplied to the speaker 406, thereby reproducing sound. The feedback circuit 5 attenuates the amplitude of an output signal from the power switch 3 to an appropriate level and supplies it to the correction circuit 2.

The pulse modulator 1 includes a delta-sigma modulating device 1*a* for delta-sigma modulation of a digitized audio signal and a pulse modulated signal converting device 1*b* for converting a delta-sigma modulated audio signal to a pulse modulated signal.

The dc output reference signal generator 410 includes a LPF 401 and a level adjuster 402. The arithmetic unit 411 includes a subtracter 403 and an adder 404.

The first constant voltage control circuit 407, mainly formed by a logic circuit, stabilizes the supply voltage Vcc supplied from the external source through the power terminal 409 at a certain value and supplies the stabilized supply voltage Vcc to the pulse modulator 1.

The second constant voltage control circuit 408, also mainly formed by a logic circuit, stabilizes the supply voltage Vcc supplied from the external source through the power terminal 409 at a certain value and supplies the stabilized supply voltage Vcc to the correction circuit 2.

Although being directly connected to the terminal 409 in FIG. 22, the power switch 3 is, in practice, usually connected to the terminal 409 through a low pass filter formed by an inductor and a capacitor. However, such low pass filter is to remove a high-frequency noise contained in the supply voltage Vcc supplied through the terminal 409 and it does not produce the effect of suppressing voltage fluctuations of a low frequency component in an audio frequency band, different from the constant voltage control circuits 407 and 408.

This is because the use of a constant voltage control circuit for stabilizing voltage supplied to the power switch 3 requiring relatively great power will bring about a disadvantage that great power loss occurs in the constant voltage control circuit and will increase costs for mounting the constant voltage control circuit.

In the present embodiment, the correction circuit 2 for correcting a feedback signal is used in place of a constant voltage control circuit and has the same configuration as that shown in FIG. 2, repeated explanation of which is thus omitted here. Further, signal waveforms at respective points in the correction circuit 2 are the same as those shown in FIG. 3, explanation of which is also omitted here.

The class D amplifier shown in FIG. 22 performs a series of feedback operations in which a correction signal Vc is generated based on comparison between the pulse modulated signal ei output from the pulse modulator 1 and a feedback signal ef output from the power switch 3 and input to the correction circuit 2 through a feedback system (feedback circuit 5 and arithmetic unit 411) and the correction signal Vc becomes a feedback signal ef after passing through the power switch 3 and feedback system.

The waveforms shown in FIG. 3 are obtained in the case where the pulse waveform 30 of the pulse modulated signal ei and the pulse waveform 34 of the feedback signal ef have almost the same amplitude and where the delay time 6 is present but waveform distortion does not occur in the power switch 3. Further, the pulse waveform 30 and pulse waveform 33 of the correction signal Vc are similar to each other.

However, when the supply voltage Vcc supplied to the power switch 3 through the terminal 409 exceeds a preset value and the amplitude of the pulse waveform 34 accordingly becomes greater than that of the pulse waveform 30, an output signal from the second integrator 24 increases in level, causing the integrated waveform 32 to be shifted upwards as compared to FIG. 3.

In this case, as shown in FIG. 10, time periods during which the integrated waveform 31 exceeds the integrated waveform 32c, i.e., time periods during which an output of the comparator 25 is in the "H" level are shortened. As described referring to FIG. 10, this reduces the pulse width of the pulse waveform of the correction signal Vc, and equalizes the pulse area of the pulse waveform 34c corresponding to one cycle of the frequency to the pulse area of the pulse waveform 30 corresponding to one cycle of the frequency. With this process, correction for increase in the supply voltage Vcc supplied to the power switch 3 is performed.

To the contrary, when the supply voltage Vcc supplied to the power switch 3 through the terminal 409 is below a preset value and the amplitude of the pulse waveform 34 accordingly becomes smaller than that of the pulse waveform 30, an output signal from the second integrator 24 is reduced in level, causing the integrated waveform 32 to be shifted downwards as compared to FIG. 3.

In this case, as shown in FIG. 11, time periods during which the integrated waveform 31 exceeds the integrated waveform 32d, i.e., time periods during which an output of the comparator 25 is in the "H" level are extended. As described referring to FIG. 11, this increases the pulse width of the pulse waveform of the correction signal Vc, and equalizes the pulse area of the pulse waveform 34d corresponding to one cycle of the frequency to the pulse area of the pulse waveform 30 corresponding to one cycle of the frequency. With this process, correction for reduction in the supply voltage Vcc supplied to the power switch 3 is performed.

As described, the correction circuit 2 outputs the correction signal Vc while performing correction (of the pulse) on the pulse modulated signal ei based on the feedback signal ef.

The specific circuit configuration of the correction circuit 2 is shown in FIG. 12.

In the forgoing description, the pulse modulated signal ei input to the correction circuit 2 from the pulse modulator 1 and the feedback signal ef output from the power switch 3 and input to the correction circuit 2 after being appropriately attenuated both include a dc component.

The correction circuit 2 performs correction including the dc component. The reasons will be described below.

The pulse modulated signal ei is basically a binary pulse signal though including a dc component, and presents predetermined voltage values at respective points in the circuit in each of the two levels "H" and "L". Therefore, it is difficult to use conventional means taken in an analog circuit for blocking a dc component by a capacitor, for example, and independently setting a dc operating point alone.

Further, the correction circuit 2 includes therein the integrators having high dc gains, and thus, stabilization of operating points of the circuit by dc feedback through the integrators is realistic.

The above-described correction including the dc component does not cause a problem when the supply voltage Vcc varies little. However, when the supply voltage Vcc varies greatly, a problem arises.

For instance, instruments equipped with a car are generally required to operate without errors even with the supply voltage Vcc varying within a range between 11V and 16V. Thus, when the design center is set at 13.2V, an operation without errors needs to be ensured even with the supply voltage Vcc varying within a range of approximately ±20%.

Under such conditions, performing correction including a dc component for suppressing distortion in an output signal from the power switch 3 causes a problem in that an audio signal output when no distortion occurs (i.e., the level of an output voltage) is rapidly reduced in the case where the supply voltage Vcc decreases as described below.

For instance, when the supply voltage Vcc is set at 13.2V which is the design center in the class D amplifier shown in FIG. 22 including the correction circuit 2, it is assumed that the gain of the correction circuit 2 is adjusted such that a dc potential output from the class D amplifier (hereinafter referred to as "amplifier output dc potential") is 6.6V, which is one-half of the value of the supply voltage Vcc, in the case where the pulse modulated signal ei from the pulse modulator 1 has a duty ratio of 50% (hereinafter referred to as "non-modulation case").

In this case, even if the supply voltage Vcc varies in a range between 11V and 16V, the amplifier output dc potential in the non-modulation case of the pulse modulated signal ei is maintained at approximately 6.6V even with the correction is performed.

Further, in the above-described gain adjustment, the amplifier output dc potential reaches 11V in the case where the pulse modulated signal ei output from the pulse modulator 1 has a pulse duty ratio of approximately 80% when the supply voltage Vcc is set at 13.2V which is the design center. However, when the supply voltage Vcc is reduced from 13.2V to 11V, the above-described correction allows the amplifier output dc potential to reach 11V in the case where the pulse modulated signal ei output from the pulse modulator 1 has a pulse duty ratio of approximately 80%. This means, when the supply voltage Vcc is reduced to 11V, the amplifier output is driven into saturation at the time which the pulse duty ratio of the pulse modulated signal ei exceeds approximately 80%.

Figure 23:
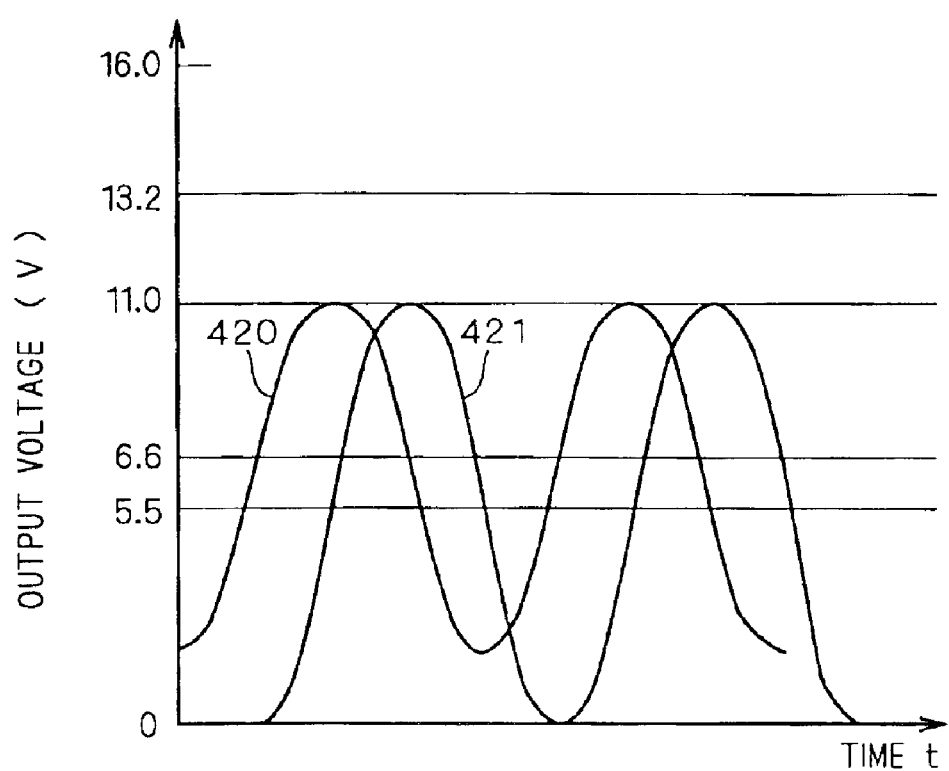
FIG. 23 illustrates output waveforms of the class D amplifier according to the third preferred embodiment.

FIG. 23 is a graph explaining this state with waveforms. In FIG. 23, a reference numeral 420 represents a waveform (sine wave) of output voltage when the supply voltage Vcc is reduced to 11V with the amplifier output dc potential in the non-modulation case being set at 6.6V. The level of this output voltage is (11−6.6)×2=8.8Vpp.

Here, shifting the amplifier output dc potential in the non-modulation case to 5.5V which is one-half of the value of the supply voltage (11V) at this time, the waveform (sine wave) of output voltage is represented by 421. In this case, the level of output voltage is increased to 5.5×2=11Vpp.

As described, in the case where the supply voltage Vcc fluctuates within a relatively wide range, it is preferable that the amplifier output dc potential determined in correspondence with the pulse duty ratio of the pulse modulated signal ei should be changed in accordance with fluctuations in the supply voltage Vcc in order to increase the level of output voltage as high as possible. Specifically, it is preferable to change the setting of the feedback system such that the amplifier output dc potential in the non-modulation case is always one-half of the value of the supply voltage Vcc.

Therefore, the dc output reference signal generator 410 and arithmetic unit 411 are provided in the present embodiment as shown in FIG. 22. These components will be described below.

The dc output reference signal generator 410 generates a reference signal used for maintaining the amplifier output dc potential in the non-modulation case at a target value. It has already been described that the target value of the amplifier output dc potential in the non-modulation case is one-half of the value of the supply voltage Vcc supplied to the power switch 3.

Therefore, in the present embodiment, with respect to the gain 1/K of the feedback circuit 5, the dc output reference signal generator 410 attenuates input voltage, i.e., supply voltage Vcc to Vcc/(2·K) by the level adjuster 402 provided therein having a gain of 1/(2·K).

Since an ac fluctuation component contained in the supply voltage Vcc is removed by the LPF 401 in the dc output reference signal generator 410, a reference signal as generated is not affected by ac fluctuations.

In the arithmetic unit 411, the subtracter 403 subtracts a dc output reference signal output from the dc output reference signal generator 410 from the output voltage of the feedback circuit 5, and the adder 404 adds a fixed potential Vsig/2 to a voltage obtained by subtraction. Here, representing a dc component contained in the output of the power switch 3 by Vsw, output voltage Vfb of the arithmetic unit 411 can be expressed as follows:

$$Vfb=Vsw/K-Vcc/(2 \cdot K)+Vsig/2 \quad (5)$$

Here, in the case of non-modulation case of the pulse modulated signal ei, the correction circuit 2 operates in such a manner that a low-frequency component contained in the feedback signal ef, i.e., Vfb equals to a low frequency component Vsig/2 contained in the pulse modulated signal ei.

Therefore, introducing the relation Vfb=Vsig/2 into the expression (5), Vsw equals to Vcc/2. Since the LPF 4 generates the output of the class D amplifier from the dc component Vsw, the above configuration allows an audio signal input to the speaker 406 to be reproduced.

Although the present embodiment has described that subtraction and addition processes in the arithmetic unit 411 are performed on the dc potential of a signal passed through the feedback circuit 5, these processes may directly be performed on the output of the power switch 3 and the result may be attenuated through the feedback circuit 5.

In that case, it is needless to say that a signal to be subtracted should have a value of Vcc/2 and a signal to be added should have a value of K·Vsig/2. The subtraction and addition processes may be performed in the opposite order.

Fourth Preferred Embodiment

Figure 24:
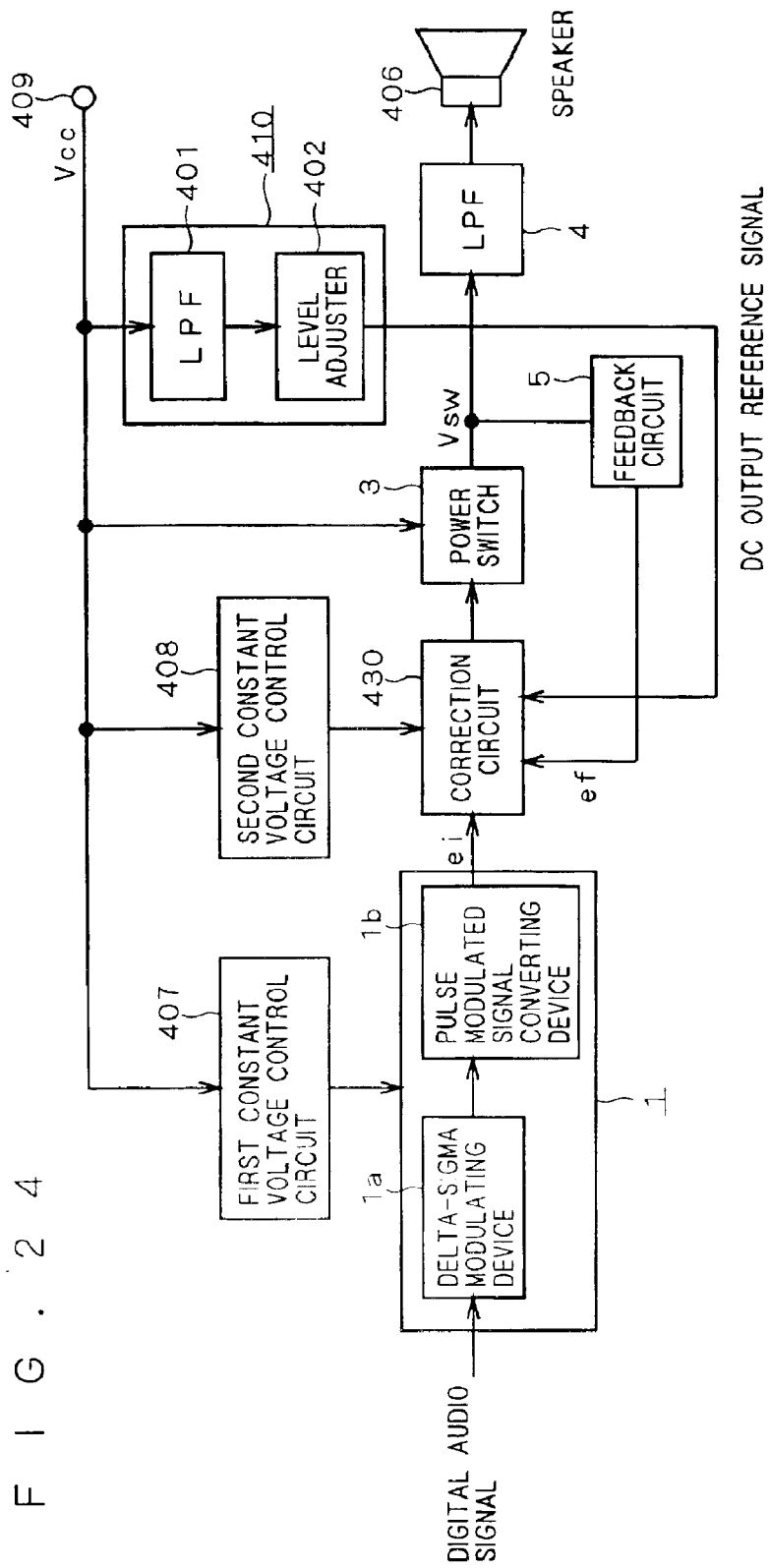
FIG. 24 is a block diagram illustrating the configuration of a class D amplifier according to a fourth preferred embodiment of the invention.

FIG. 24 is a block diagram illustrating the configuration of a class D amplifier according to a fourth preferred embodiment of the present invention. The present embodiment differs from the third preferred embodiment in that the arithmetic unit 411 is not provided and a correction circuit 430 is used instead of the correction circuit 2.

The correction circuit 430 basically performs the same operation as the correction circuit 2 described in the third preferred embodiment, but includes the function of controlling the amplifier output dc potential in the non-modulation case in response to an output from the dc output reference signal generator 410. The circuit configuration of the correction circuit 430 is shown in FIG. 25.

Figure 25:
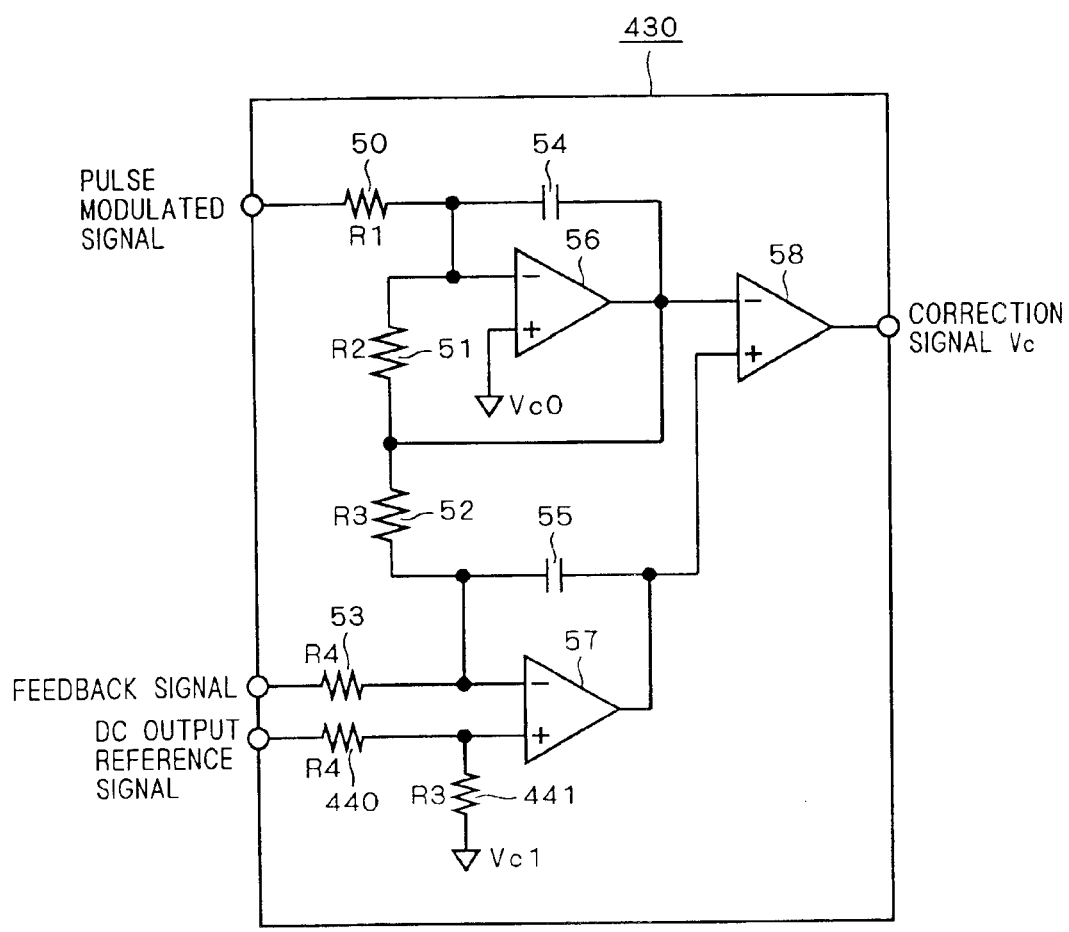
FIG. 25 is a circuit diagram illustrating a correction circuit of the class D amplifier according to the fourth preferred embodiment.

As shown in FIG. 25, the correction circuit 430 differs from the correction circuit 2 in configuration in that the output of the dc output reference signal generator 410 is applied, through a resistor 440, to the non-reverse ("+") input terminal of the operational amplifier 57 of differential input type constituting the second integrator 24, and this non-reverse ("+") input terminal is connected to a fixed potential point at which a dc fixed potential Vc1 is supplied through a resistor 441.

In the case where an integrator (second integrator 24) having a great dc gain is inserted into a path along which the feedback signal ef is transmitted as in the illustrated circuit configuration, a dc operating point determined by feedback operation is mainly determined by the operation of the integrator (second integrator 24).

Specifically, the second integrator 24 constituted by the operational amplifier 57 has gain of the operational amplifier 57 in the state where a dc signal is hardly fed back. Thus, however a dc output potential from the operational amplifier 56 changes as a result of feedback operation, the resulting difference between differential inputs of the operational amplifier 57 is small. In other words, dc operating points at associated locations are determined such that this condition is satisfied.

It is not practically difficult to increase the impedance at the "−" input terminal and "+" input terminal of the operational amplifier 57 to be sufficiently greater than the resistivities of the resistors 52, 53 connected to the "−" input terminal and the resistors 440, 441 connected to the "+" input terminal of the operational amplifier 57, and to reduce the output impedance of components which supply signals through the resistors 52, 53, 440 and 441 to be sufficiently lower than the resistivities of the resistors 52, 53, 440 and 441.

For ease of description, the resistors 52 and 441 shall have the same resistivity R3, and the resistors 53 and 440 shall have the same resistivity R4, and an output from the dc output reference signal generator 410 shall be Vcc/(2·K) as in the third preferred embodiment. Then, a dc potential Vp at the "+" input terminal of the operational amplifier 57 is expressed as follows:

$$Vp = (Vc1 \cdot R4 + Vcc \cdot R/(2 \cdot K))/(R3 + R4) \tag{6}$$

Further, representing a dc potential at the "−" input terminal of the operational amplifier 57 by Vn, the capacitor 55 has an infinite impedance with respect to a dc component, influence of which can be neglected. Thus, the following expression holds:

$$Vn = (Vt0 \cdot R4 + Vfb \cdot R3)/(R3 + R4) \tag{7}$$

where Vt0 is a dc potential output from the operational amplifier 56 and Vfb is a dc potential output from the feedback circuit 5.

Provided that the dc potential in the non-modulation case of an input pulse modulated signal ei is Vsig/2 and Vt0 has a value of Vt00 at this time, the following expression holds:

$$Vt00 = Vc0 \cdot (R1 + R2)/R1 - Vsig \cdot R2/(2 \cdot R1) \tag{8}$$

where R1 is the resistivity of the resistor 50 and R2 is the resistivity of the resistor 51.

As shown in this expression, The value Vt00 is a fixed value determined by a dc potential of the pulse modulated signal ei, a fixed potential Vc0 supplied to the "+" input terminal of the operational amplifier 56 and the resistivities of the resistors 50 and 51. Therefore, setting the fixed potential Vc1 to be equal to Vt00, the expressions (6) and (7) in the non-modulation case of the pulse modulated signal ei become equal also in the first term on the right side.

As previously described, when the correction circuit 430 operates normally, Vp and Vn expressed in the expressions (6) and (7) are almost equal to each other. In this case, the expressions (6) and (7) thus become equal in the second term on the right side. That is, the expression Vfb=Vcc/(2·K) holds. This shows the feedback operation is carried out such that the dc potential of the feedback signal ef becomes equal to a dc output reference signal in the non-modulation case of the pulse modulated signal ei.

Further, provided that the power switch 3 has a dc component Vsw and the expression Vfb=Vsw/K holds, the feedback operation is carried out such that Vsw becomes one-half of the value of the supply voltage Vcc.

It is possible to set all the resistivities R1 to R4 to be the same resistivity R and the fixed potential Vc0 is set at Vsig/2, as setting conditions. This allows the expressions Vt00=Vsig/2 and Vc1=Vsig/2 to hold, which simplifies the circuit configuration.

Although the resistors 52 and 441 have the same resistivity and the resistors 53 and 440 have the same resistivity in the above-described circuit configuration, the same effects can be obtained even if the resistors have difference resistivities from each other.

Further, a configuration, though somewhat complicated, may be employed which is provided with a device for reversing an output signal of the dc output reference signal generator 410 instead of transmitting this output signal to the "+" input terminal of the operational amplifier 57 constituting the second integrator 24, i.e., a device for reversing the direction of increase/decrease in potential of the dc output reference signal with respect to increase/decrease of the supply voltage Vcc, wherein a reversed signal is supplied to the "−" input terminal of the operational amplifier 57 through a resistor. In this case, the potential at the "+" input terminal of the operational amplifier 57 is fixed, which achieves improved realizability of the operational amplifier 57.

Although the output stage of the class D amplifier has been described as single-ended in the above description, the present invention may not be limited thereto but may also be applied to a so-called BTL configuration having two output stages for outputting audio signals 180° out of phase with each other. That is, additionally applying the correction circuit according to the present invention to each output stage in the BTL configuration, the effects of correction of distortion can be obtained.

Fifth Preferred Embodiment

Figure 26:
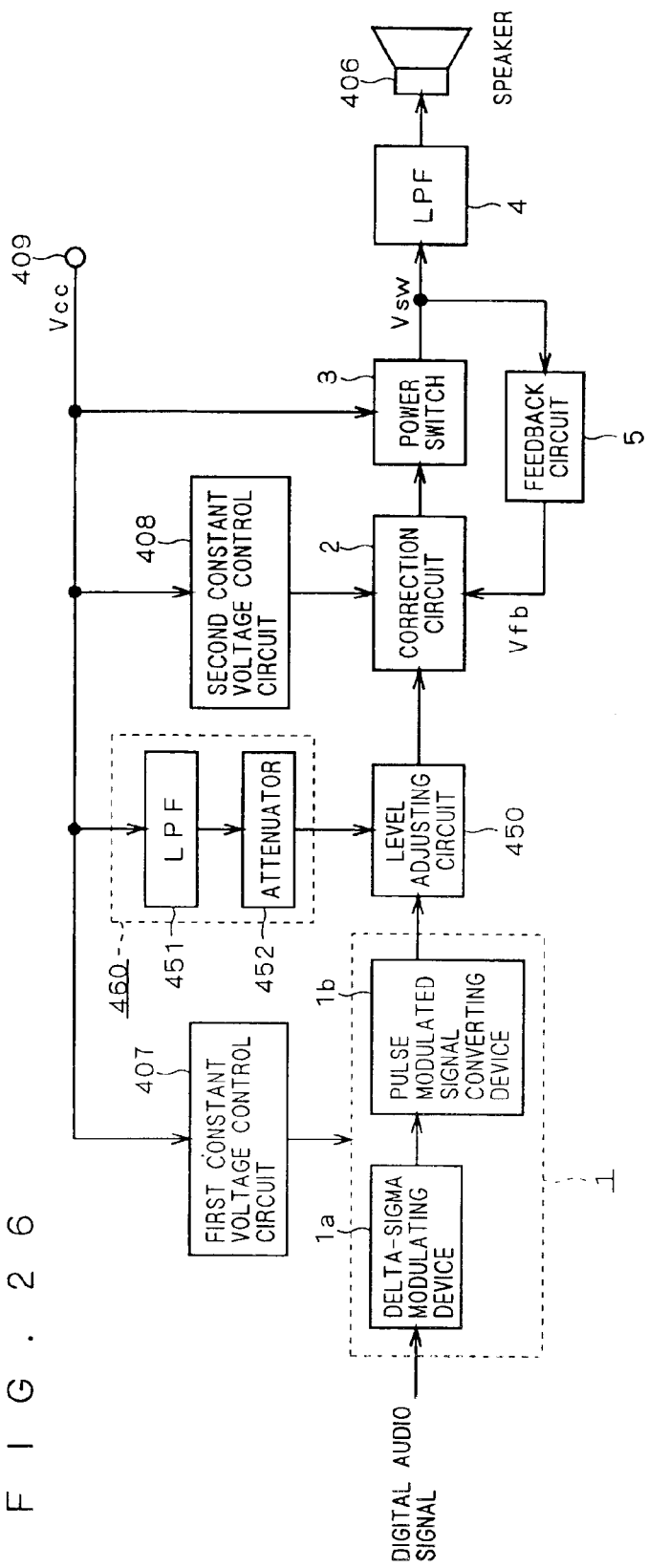
FIG. 26 is a block diagram illustrating the configuration of a class D amplifier according to a fifth preferred embodiment of the invention.

FIG. 26 is a block diagram illustrating the configuration of a class D amplifier according to a fifth preferred embodiment of the present invention.

The class D amplifier includes the pulse modulator 1, a level adjusting circuit 450, the correction circuit 2, power switch 3, feedback circuit 5, LPF 4, speaker 406, first constant voltage control circuit 407, second constant voltage control circuit 408 and a level reference signal generator 460. The supply voltage Vcc is supplied to the class D amplifier from an external source through the power terminal 409.

The pulse modulator 1 includes the delta-sigma modulating device 1a for delta-sigma modulation of a digitized audio signal and the pulse modulated signal converting device 1b for converting a delta-sigma modulated audio signal to a pulse modulated signal. The level reference signal generator 460 includes a LPF 451 and an attenuator 452.

The pulse modulator 1 generates a pulse modulated signal which is a binary pulse signal obtained by modulating the pulse width of an audio signal. The power switch 3 performs a switching operation in accordance with a logic value of a correction signal whose level (amplitude) is adjusted by the level adjusting circuit 450 and whose pulse width is further corrected by the correction circuit 2, enabling power supply to a load (speaker 406) connected to the output of the class D amplifier. The switching operation is carried out by switching devices configured as described in the first preferred embodiment.

The LPF 4 removes a high frequency component from an output signal from the power switch 3 to demodulate an audio signal to be supplied to the speaker 406, thereby reproducing sound. The feedback circuit 5 attenuates the amplitude of the output signal from the power switch 3 to an appropriate level and supplies (feeds back) the output signal to the correction circuit 2.

The first constant voltage control circuit 407 stabilizes the supply voltage Vcc supplied from the external source through the power terminal 409 at a certain value and supplies the stabilized supply voltage Vcc to the pulse modulator 1. The second constant voltage control circuit 408 stabilizes the supply voltage Vcc supplied from the external source through the power terminal 409 at a certain value and supplies the stabilized supply voltage Vcc to the correction circuit 2.

Although being directly connected to the terminal 409 in FIG. 26, the power switch 3 is, in practice, usually connected to the terminal 409 through a low pass filter formed by an inductor and a capacitor.

However, such low pass filter is to remove a high-frequency noise contained in the supply voltage Vcc and it does not sufficiently produce the effects of suppressing voltage fluctuations of a low frequency component in an audio frequency band, different from the constant voltage control circuits 407 and 408.

This is because the use of a constant voltage control circuit for stabilizing voltage to be supplied to the power switch 3 requiring relatively great power will bring about a disadvantage that great power loss occurs in the constant voltage control circuit and will increase costs for mounting the constant voltage control circuit. In the present embodiment, the correction circuit 2 for correcting a feedback signal is used in place of a constant voltage control circuit.

The correction circuit 2 has the same inner configuration as that shown in FIG. 2, repeated explanation of which is thus omitted here. Further, signal waveforms at respective points in the correction circuit 2 are the same as those shown in FIG. 3. In the present embodiment, the pulse waveform 30 is a pulse modulated signal (hereinafter referred to as level-adjusted pulse modulated signal) output from the level adjusting circuit 450.

As described, a series of feedback operations are performed in which the correction circuit 2 generates and outputs the correction signal Vc based on comparison between a level-adjusted pulse modulated signal output from the level adjusting circuit 450 and a feedback signal output from the power switch 3 and input to the correction circuit 2 through the feedback circuit 5, and the correction signal Vc becomes a feedback signal after passing through the power switch 3 and feedback circuit 5.

As described in the first preferred embodiment, FIG. 3 illustrates waveforms at respective points in the correction circuit 2 when no distortion occurs in the power switch 3. When distortion occurs in the power switch 3, the waveforms vary as shown in FIGS. 8 to 11 by the correction circuit 2 as described in the first preferred embodiment.

The correction circuit 2 basically performs correction (pulse width correction) on an input level-adjusted pulse modulated signal in accordance with the difference in low frequency component between the level-adjusted pulse modulated signal and feedback signal, thereby outputting a correction signal. Consequently, even if the supply voltage Vcc to be supplied to the power switch 3 varies, a high-quality audio signal without distortion can be obtained provided that the supply voltage Vcc varies within a certain range.

However, in the case where the supply voltage Vcc supplied to the power switch 3 varies greatly beyond the above-described range, the following problems arise.

Figure 27:
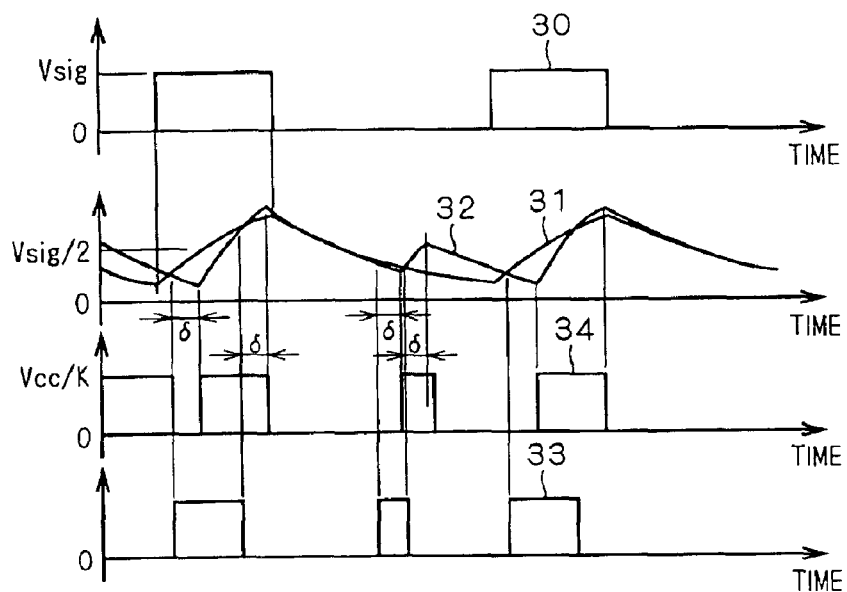
FIG. 27 illustrates signal waveforms in respective components of a correction circuit of the class D amplifier according to the fifth preferred embodiment.

That is, when the supply voltage Vcc to be supplied to the power switch 3 increases over an appropriate value and the amplitude of the pulse waveform 34 becomes considerably greater than that of the pulse waveform 30, the upper side of the integrated waveform 32 formed based on the pulse waveform 34 has a sharper inclination than that of the integrated waveform 31 formed based on the pulse waveform 30, as shown in FIG. 27. Thus, the integrated waveforms 31 and 32 cross each other at a time period before reaching a half cycle of the pulse waveform 30, causing the correction circuit 2 and power switch 3 to output new pulses. Hereinafter, this will be called waveform-dividing phenomenon.

Even if this waveform-dividing phenomenon occurs, influence upon sound quality such as distortion is small since correction is performed on a low frequency component of the pulse modulated signal, however, increase in the number of On/Off operations of the power switch 3 disadvantageously increases power loss and electromagnetic wave generated by the power switch 3.

In the present embodiment, the level adjusting circuit 450 is provided in order to prevent the occurrence of such waveform-dividing phenomenon. The operation of the level adjusting circuit 450 will be described below.

Figure 28:
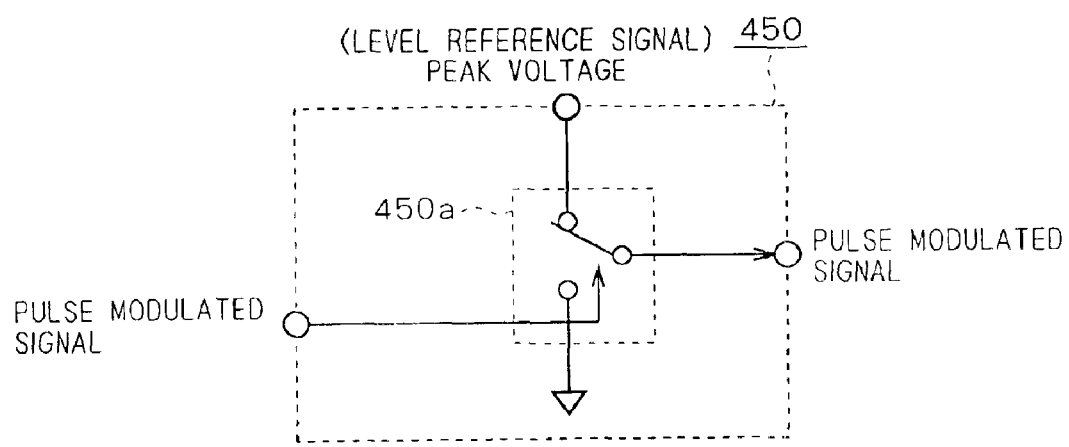
FIG. 28 illustrates the inner configuration of a level adjusting circuit of the class D amplifier according to the fifth preferred embodiment.

The level adjusting circuit 450 may be of the configuration shown in FIG. 28. In FIG. 28, an analog switch 450a performs a switching operation of selecting and outputting either of an input peak voltage and a ground potential in accordance with the logic level of the pulse modulated signal supplied from the pulse modulator 1.

An output signal from the level adjusting circuit 450 has the same pulse width as the pulse modulated signal, whose amplitude alone is adjusted to a value equal to an input peak voltage.

In the level reference signal generator 460, an fluctuation component of a relatively high frequency containing an audio signal band is attenuated from the supply voltage Vcc in the LPF 451, and is further attenuated in the attenuator 452 to approximately 1/K. A resulting voltage is output to the level adjusting circuit 450 as a peak voltage (level reference signal).

As a result, the amplitude (peak value) of the level-adjusted pulse modulated signal input to the correction circuit 2 becomes approximately Vcc/K. This value is almost equal to the amplitude of the feedback signal output from the feedback circuit 5, as previously described.

The reason why the waveform-dividing phenomenon occurs is that the amplitude of the feedback signal increases beyond the limit as compared to the amplitude of the pulse modulated signal. In this preferred embodiment, the level adjusting circuit 450 adjusts the amplitude of the level-adjusted pulse modulated signal to be input to the correction circuit 2 to be almost equal to the amplitude of the feedback signal, which can prevent the occurrence of the waveform-dividing phenomenon.

Adjusting the amplitude of the pulse modulated signal causes an audio signal component contained in the pulse modulated signal to vary in the level as well. The correction circuit 2, as previously described, operates so as to bring an audio signal component contained in the feedback signal into correspondence with an audio signal component contained in the pulse modulated signal.

Therefore, in the present embodiment, an output audio signal varies in level in accordance with fluctuations in the supply voltage Vcc with the adjustment performed by the level adjusting circuit 450, causing the effects of correction in the correction circuit 2 to be partly lost.

However, by setting a cutoff frequency of the LPF 451 in the level reference signal generator 460 at a sufficiently low value, it is possible to prevent fast fluctuations in the supply voltage Vcc (fluctuations in a relatively high frequency band) from appearing in an output of the level reference signal generator 460 and to prevent the level adjusting circuit 450 from performing adjustment on such fast fluctuations.

With such setting, the pulse width is corrected by the correction circuit 2 to sufficiently prevent the occurrence of distortion with respect to relatively fast fluctuations in the supply voltage Vcc in an audio frequency band, and with respect to relatively gentle fluctuations, i.e., great fluctuations in a relatively low frequency, correction of the pulse width is stopped and the amplitude of the pulse modulated signal is adjusted to prevent the occurrence of the waveform-dividing phenomenon, which can prevent deterioration in efficiency and electromagnetic interference.

Although the present embodiment has described the feedback circuit 5 having a gain of 1/K and the attenuator 452 also having an attenuation ratio of 1/K, this is directed to the case where a process for the pulse modulated signal and that for the feedback signal performed by the correction circuit 2 are almost the same, and in general, the processes are not necessarily be equal to each other.

Sixth Preferred Embodiment

In the fifth preferred embodiment, with respect to fluctuations in the supply voltage Vcc in a relatively low frequency band, the level adjusting circuit 450 adjusts the level of the level-adjusted pulse modulated signal to be input to the correction circuit 2, thereby preventing the occurrence of the waveform-dividing phenomenon. However, the level of an audio signal output from the class D amplifier varies in accordance with fluctuations in the supply voltage Vcc, causing volume fluctuations of the speaker 406.

The class D amplifier according to a sixth preferred embodiment to be described below has a configuration capable of preventing the occurrence of the waveform-dividing phenomenon while preventing volume fluctuations in accordance with fluctuations in the supply voltage Vcc.

Figure 29:
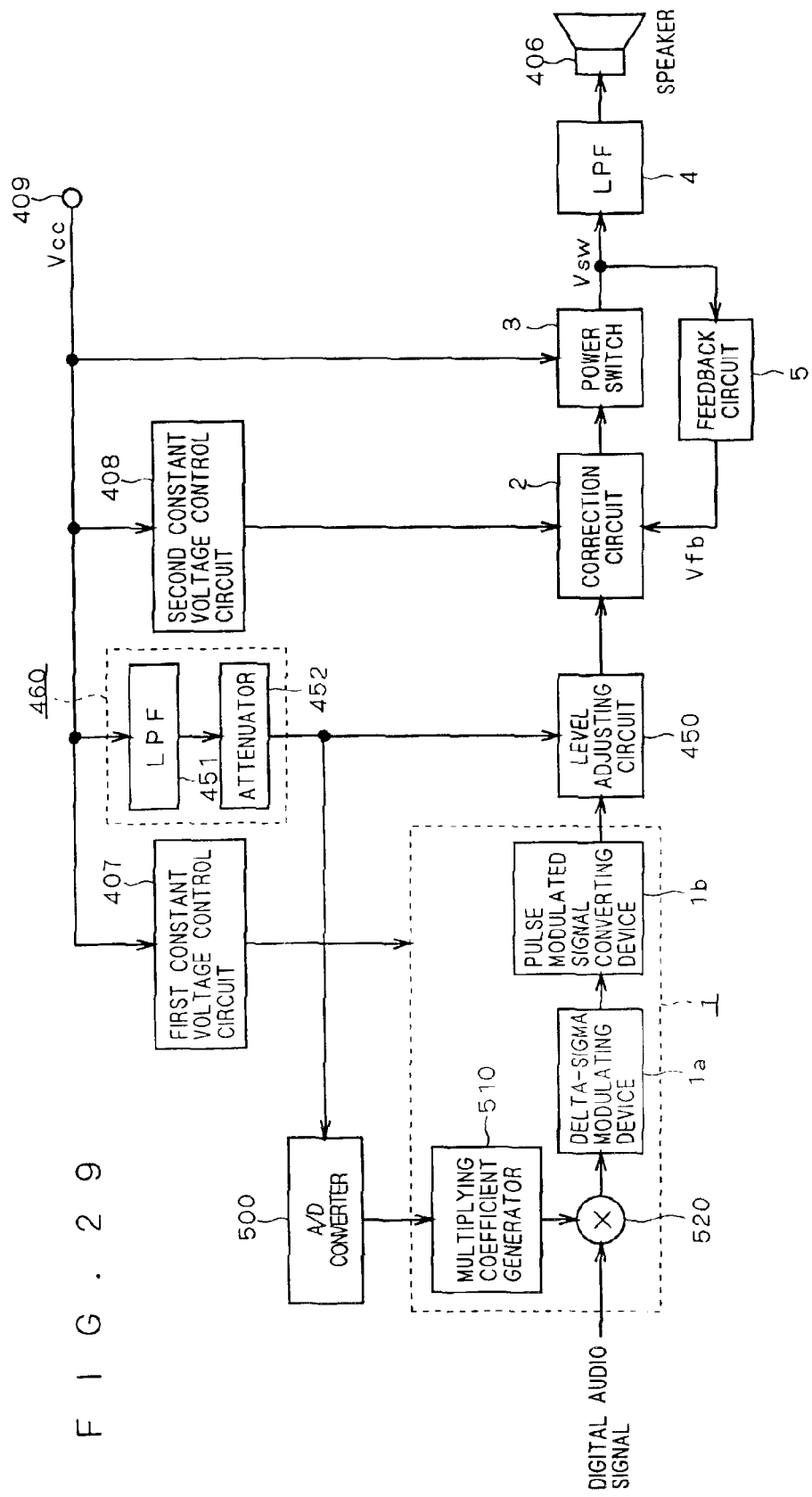
FIG. 29 is a block diagram illustrating the configuration of a class D amplifier according to a sixth preferred embodiment of the invention.

FIG. 29 is a block diagram illustrating the configuration of the class D amplifier according to the present embodiment. As in the fifth preferred embodiment, the class D amplifier of the present embodiment also comprises the pulse modulator 1, level adjusting circuit 450, correction circuit 2, power switch 3, feedback circuit 5, LPF 4, speaker 406, first constant voltage control circuit 407, second constant voltage control circuit 408 and level reference signal generator 460. The class D amplifier is supplied with a supply voltage Vcc from an external source through a power terminal 409.

The class D amplifier of the present embodiment differs from that of the fifth preferred embodiment in that an A/D converter 500 is added and the pulse modulator 1 is further provided with a multiplying coefficient generator 510 and a multiplier 520.

In the present embodiment, the level reference signal generator 460 also functions as a modulation index control signal generator for generating a signal which controls a multiplying coefficient (i.e., modulation index) to be supplied to the multiplier 520 (hereinafter referred to as modulation index control signal). The A/D converter 500 converts the modulation index control signal output from the level reference signal generator 460 to digital data, and provides a digitized modulation index control signal for the multiplying coefficient generator 510 in the pulse modulator 1. The multiplying coefficient generator 510 normalizes an input when the supply voltage Vcc is equal to a preset value to 1, and obtains the reciprocal of a normalized input for providing the multiplier 520 with the obtained reciprocal as a multiplying coefficient, i.e., modulation index. The multiplier 520 multiplies an audio signal given as digital data with this multiplying coefficient. The A/D converter 500, multiplying coefficient generator 510 and multiplier 520 constitute a modulation index controlling circuit.

Accordingly, adjustment given on an audio signal in the level adjusting circuit 450 is cancelled out, which can prevent volume fluctuations of the speaker 406. This operation will be described below.

An output of the level reference signal generator 460 when the supply voltage Vcc is a preset value shall be normalized to 1, and an audio signal component contained in an output of the level adjusting circuit 450 when the supply voltage Vcc is a preset value shall be represented by e1. Then, representing a normalized output from the level reference signal generator 460 by G, the audio signal component contained in the output of the level adjusting circuit 450 can be expressed as G·e1.

Further, representing audio signal data to be input to the delta-sigma modulating device 1a by e0, the expression e1=M·e0 holds where M is a conversion gain in the delta-sigma modulating device 1a and pulse modulated signal converting device 1b.

Here, normalizing an output of the AD converter 500 when the supply voltage Vcc is a preset value to 1, the normalized output of the AD converter 500 becomes almost equal to above-described G. The multiplying coefficient generator 510 calculates the reciprocal of the normalized output, whose output becomes almost 1/G.

Here, representing an audio signal input to the multiplier 520 by e00, the expression e0=e00/G holds.

Therefore, the audio signal component contained in the output of the level adjusting circuit 450 is expressed as G·M·e0=M·e00, where G is not included. This shows the audio signal component to be input to the correction circuit 2 is not affected by fluctuations in the value G due to fluctuations in the supply voltage Vcc, causing no volume fluctuations.

Seventh Preferred Embodiment

The sixth preferred embodiment performs predetermined processes on an input audio signal in the pulse modulator 1 to prevent the occurrence of the waveform-dividing phenomenon while preventing the occurrence of volume fluctuations due to fluctuations in the supply voltage Vcc.

However, the addition of the AD converter 500, multiplying coefficient generator 510 and multiplier 520 for performing such predetermined processes on an input audio signal inevitably causes disadvantages such as cost increase.

Considering that the waveform-dividing phenomenon actually occurs when the supply voltage Vcc increases beyond a certain limit, the present embodiment provides a configuration in which the level-adjusted pulse modulated signal output from the level adjusting circuit 450 has a certain amplitude before reaching this limit, and only when the supply voltage Vcc increases beyond this limit, the amplitude of the level-adjusted pulse modulated signal is increased to prevent the occurrence of the waveform-dividing phenomenon. This simplifies the configuration as compared to the sixth preferred embodiment.

Figure 30:
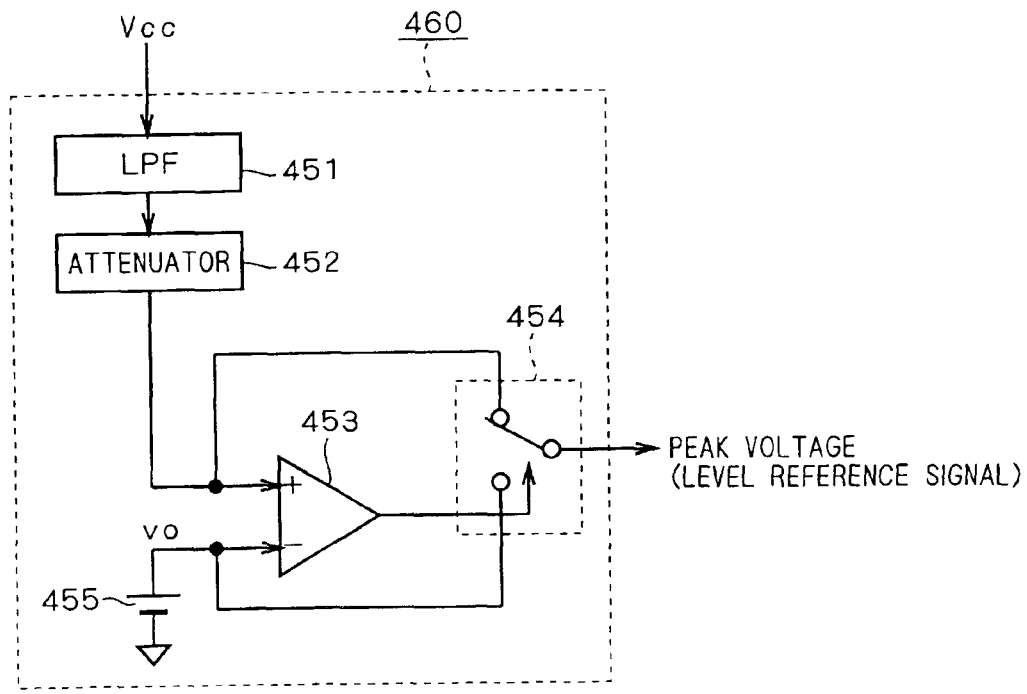
FIG. 30 illustrates the inner configuration of a level reference signal generator of a class D amplifier according to a seventh preferred embodiment of the invention.

The present embodiment presents a similar configuration as in the fifth preferred embodiment but differs from the fifth embodiment in that the level reference signal generator 460 has the inner configuration shown in FIG. 30, not that shown in FIG. 26.

In FIG. 30, the supply voltage Vcc is supplied to the "+" input terminal of a comparator 453 and one of input terminals of a switch 454 through the LPF 451 and attenuator 452.

A fixed voltage V0 is supplied from a fixed voltage source 455 to the "−" input terminal of the comparator 453. The fixed voltage V0 is also supplied to the other input terminal of the switch 454.

An output of the comparator 453 is supplied to the control input terminal of the switch 454. The switch 454 selects an output voltage of the attenuator 452 when it is higher than the fixed voltage V0, and selects the fixed voltage V0 when the output voltage of the attenuator 452 is equal to or lower than the fixed voltage V0.

Figure 31:
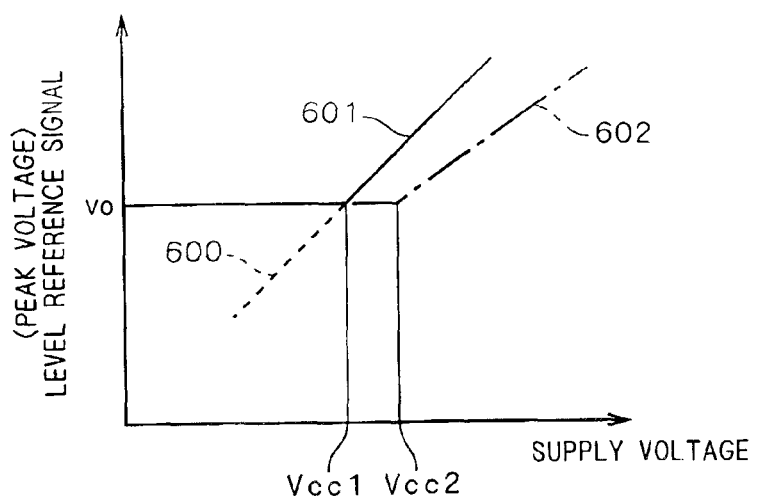
FIG. 31 is a graph plotting input-output characteristics of the level reference signal generator of the class D amplifier according to the seventh preferred embodiment.
Figure 32:
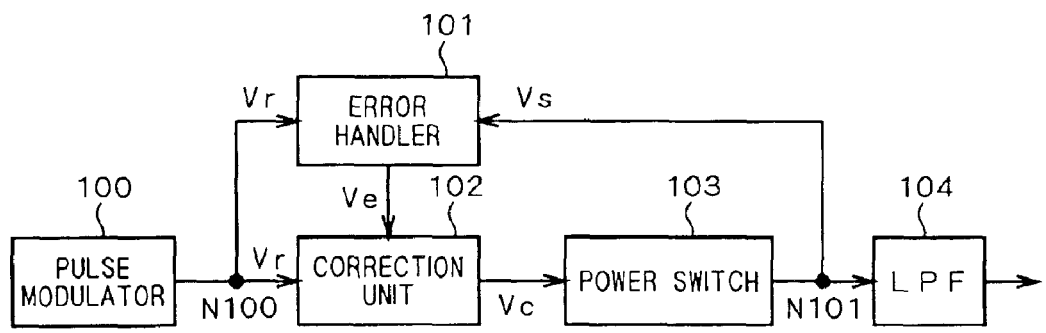
FIG. 32 is a block diagram illustrating the configuration of a class D amplifier according to a conventional technique.
Figure 33:
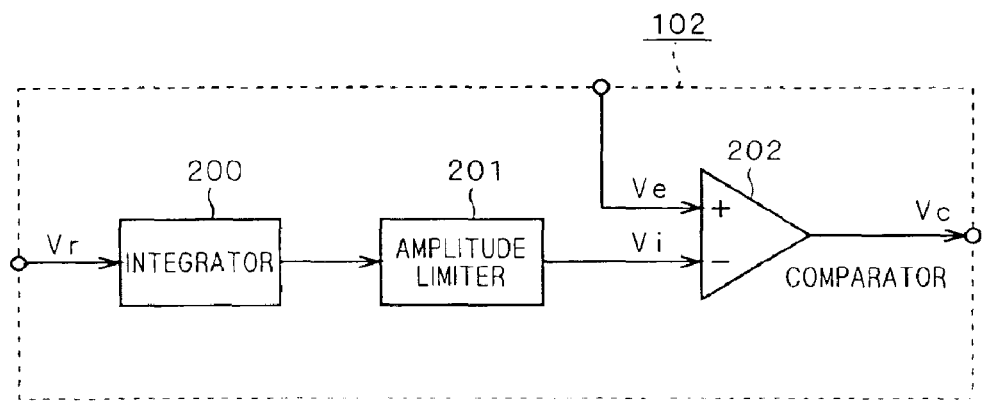
FIG. 33 is a block diagram illustrating the inner configuration of a correction unit according to the conventional technique.
Figure 34:
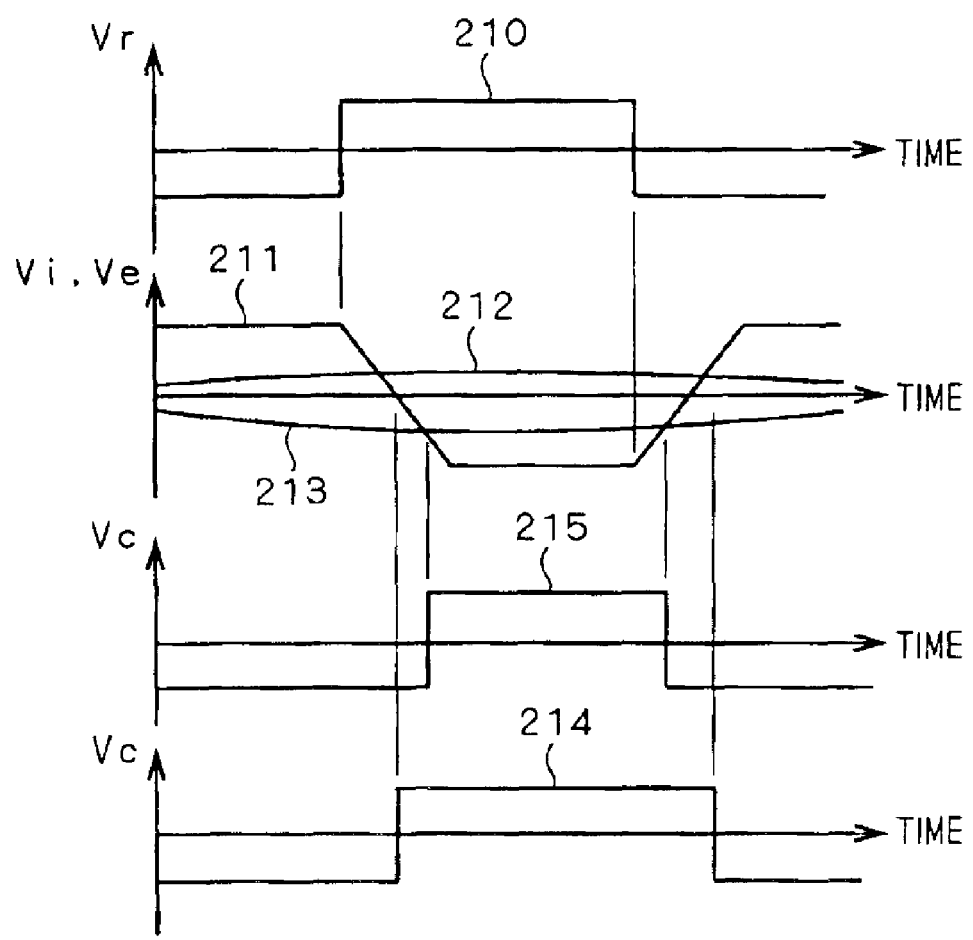
FIG. 34 is an explanatory view of correction according to the conventional technique.

Therefore, in the present embodiment, the value of the level reference signal output from the level reference signal generator 460 varies along a solid line 601 shown in FIG. 31 in accordance with fluctuations in the supply voltage Vcc. A reference character Vcc1 represents the value of a supply voltage when the output voltage of the attenuator 452 is equal to the fixed voltage V0.

In the present embodiment, the level adjusting circuit 450 performs level adjustment such that the voltage value of the level-adjusted pulse modulated signal to be output is fixed at V0 in a band where the supply voltage Vcc is lower than Vcc 1 and the amplitude of the level-adjusted pulse modulated signal to be output is increased in accordance with increase in the supply voltage Vcc in a band where the supply voltage Vcc is equal to or higher than Vcc 1.

The above operation achieves the function of preventing an audio signal level output from the class D amplifier from varying in level even with fluctuations in the supply voltage Vcc by keeping constant the amplitude of the level-adjusted pulse modulated signal output from the level adjusting circuit 450 in a band where the waveform-dividing phenomenon is not likely to occur as well as preventing the occurrence of the waveform-dividing phenomenon by increasing the amplitude of the level-adjusted pulse modulated signal output from the level adjusting circuit 450 in accordance with increase in the supply voltage Vcc in a band where the waveform-dividing phenomenon is likely to occur.

A broken line 600 shown in FIG. 31 represents characteristics in the case where the attenuator 452 provides attenuation of approximately 1/K through the whole band as in the fifth preferred embodiment. A dash-dot line 602 shown in FIG. 31 represents characteristics in the case of extending a band in which the output signal from the level reference signal generator 460 is maintained at a certain level by increasing the amount of attenuation in the attenuator 452 to exceed 1/K and changing the voltage at which the output of the level reference signal generator 460 starts to increase from Vcc1 to Vcc2. Note that it is possible to extend a band in which the output signal from the level reference signal generator 460 is maintained at a certain level by increasing the fixed voltage V0 of the fixed voltage source 455.

Adding the AD converter 500, multiplying coefficient generator 510 and multiplier 520 described in the sixth preferred embodiment to the configuration of the present embodiment makes it possible to carry out a process for preventing volume fluctuations in a band where the amplitude of the level-adjusted pulse modulated signal is increased in accordance with fluctuations in the supply voltage Vcc.

Although the output stage has been described as single-ended in the above described preferred embodiments, the present invention may also be applied to the so-called BTL configuration having two output stages for outputting audio signals 180° out of phase with each other. That is, additionally applying the present invention to each output stage in the BTL configuration, the above-described effects of correction of distortion can also be obtained.

The present invention provides a class D amplifier of high efficiency capable of considerably reducing distortion in an output signal resulting from fluctuations in the supply voltage supplied to the power switch as compared to a conventional class D amplifier, which can be used without problems even when the supply voltage fluctuates in a relatively wide range, in which an audio signal output level when no distortion occurs is reduced little.

While the invention has been shown and described in detail, the foregoing description is in all aspects illustrative and not restrictive. It is therefore understood that numerous modifications and variations can be devised without departing from the scope of the invention.

What is claimed is:

1. A class D amplifier comprising:
   a pulse modulator for generating a pulse modulated signal;
   a correction circuit for correcting a feedback signal input thereto by feedback in reference to said pulse modulated signal; and
   a power switch for generating a voltage signal on the basis of a correction signal output from said correction circuit, wherein
   said feedback signal is generated on the basis of said voltage signal,
   said correction circuit includes:
   a first integrator for performing integration on the basis of said pulse modulated signal;
   a second integrator for performing integration on the basis of said feedback signal;
   a first subtracter for obtaining a difference between a first integrated signal output from said first integrator and a second integrated signal output from said second integrator;
   a third integrator for integrating a first differential signal output from said first subtracter;
   a reverser for reversing a third integrated signal output from said third integrator; and
   a comparator for comparing said first differential signal and said third integrated signal as reversed by said reverser, thereby generating said correction signal in correspondence with the result of comparison.

2. The class D amplifier according to claim 1, wherein said correction circuit further includes:
   a gain controller for controlling gain of said first integrated signal;
   a second subtracter for obtaining a difference between an output signal from said gain controller and said pulse modulated signal, thereby generating a second differential signal to be input to said first integrator;
   a third subtracter for obtaining a difference between said output signal from said gain controller and said feedback signal, thereby generating a third differential signal to be input to said second integrator.

3. The class D amplifier according to claim 1, further comprising
   a feedback circuit for attenuating an amplitude of said voltage signal generated in said power switch and outputting said feedback signal to be input to said correction circuit.

4. The class D amplifier according to claim 1, wherein
   a constant for gain of said first integrator and a constant for gain of said second integrator are equal to each other.

* * * * *